(12) United States Patent
Asakura et al.

(10) Patent No.: US 6,287,912 B1
(45) Date of Patent: Sep. 11, 2001

(54) METHOD OF FABRICATING SEMICONDUCTOR DEVICE

(75) Inventors: Hisao Asakura, Ome; Yoshitaka Tadaki, Hannou; Toshihiro Sekiguchi, Hidaka; Ryo Nagai, Mizuho-machi; Masafumi Miyamoto, Tachikawa; Masayuki Nakamura, Ome, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/389,457

(22) Filed: Sep. 3, 1999

(30) Foreign Application Priority Data

Sep. 3, 1998 (JP) .................................... 10-248976

(51) Int. Cl.<sup>7</sup> .............................................. H01L 21/8242
(52) U.S. Cl. ............................................. 438/241; 438/981
(58) Field of Search ..................................... 438/275, 258, 438/231, 216, 981, 199, 201, 197, 287, 279, 585, 591; 257/390, 393, 316, 371; 148/116, 117, 118, 163

(56) References Cited

U.S. PATENT DOCUMENTS 5,057,448   10/1991   Kuroda .
5,986,313 * 11/1999   Ueda et al. ........................ 257/401

FOREIGN PATENT DOCUMENTS 1114069   5/1989   (JP) .

* cited by examiner

*Primary Examiner*—David Nelms
*Assistant Examiner*—David Vu
(74) *Attorney, Agent, or Firm*—Antonelli, Terry, Stout & Kraus, LLP

(57) ABSTRACT

A mask for etching a relatively thin gate insulating film formed in a gate insulating film forming region is formed by patterning a photoresist film, and the mask is used for introducing an impurity for adjusting the threshold voltages of n-channel field-effect transistors and p-channel field-effect transistors having the relatively thin gate insulating film into regions on the semiconductor substrate not covered with the mask.

17 Claims, 22 Drawing Sheets

METHOD OF FABRICATING SEMICONDUCTOR DEVICE

The present invention relates to techniques for fabricating semiconductor devices and, more particularly, to techniques applicable to the fabrication of a semiconductor device provided with gate insulating films of differing thickness formed on a semiconductor substrate.

A voltage of an external power supply at a level specified by an I/O (input-output) standard is applied to MISFETs (metal-insulator semiconductor field-effect transistors) included in an I/O circuit or the like among the transistors included in a semiconductor device, and a different voltage must be applied to MISFETs included in internal circuits of the semiconductor device for the optimum functioning of those MISFETs. For example, it is advantageous to apply a voltage higher than that applied to peripheral circuits to a MIS transistor included in a memory cell of a DRAM (dynamic random-access memory) which is capable of retaining information therein to extend the data retaining time. However, in a microcomputer logic LSI circuit, a voltage lower than a supply voltage must be applied to a MIS transistor included in the internal circuit to enable high-speed operations and to reduce power consumption.

The field strength exerted on a gate insulating film must be kept at a predetermined value to prevent the breakdown of the gate of a MISFET. Therefore, when only one gate insulating film is formed on a semiconductor substrate, the gate insulating film is formed with a thickness meeting the requirement of a high-voltage part. However, when the gate insulating film is formed with such a thickness, the field strength in a low-voltage part decreases and hence the driving ability of the MISFET decreases. Consequently, the signal processing speed of the LSI circuit including the MISFET is reduced. To prevent the reduction of the signal processing speed of the LSI circuit, a part of the gate insulating film corresponding to the high-voltage part needs to be formed with a relatively great thickness, and a part of the gate insulating film corresponding to the low-voltage part needs to be formed with a relatively small thickness; that is, two gate insulating films having respectively different design thicknesses are formed on the semiconductor substrate. A semiconductor device having a microprocessor is mentioned in, for example, U.S. Pat. No. 5,057,448.

SUMMARY OF THE INVENTION

The inventors of the present invention have studied a doping technique for adjusting the threshold voltages of an n-channel MISFET and a p-channel MISFET in a semiconductor device provided with the n-channel MISFET and the p-channel MISFET formed on a semiconductor substrate and provided with at least two gate insulating films having respectively different thicknesses. This doping technique uses separate photoresist masks for the ion implantation of a dopant to adjust the threshold voltages of the n-channel MISFET and the p-channel MISFET. The inventors of the present invention have found the following problems in this doping technique which uses separate photoresist masks for the ion implantation of dopants to adjust the threshold voltages of the n-channel MISFET and the p-channel MISFET.

This known technique needs an increased number of photomasks and an increased number of processes for forming photoresist patterns and for removing the photoresist patterns, which inevitably leade to an increase in the time required for fabricating semiconductor devices, as well as semiconductor device manufacturing costs. Furthermore, since processes for forming and removing photoresist patterns produce foreign matter, an increase in the number of processes reduces the reliability and the yield rate of the semiconductor devices.

The inventors of the present invention have made investigations into known threshold voltage adjusting techniques for adjusting the threshold voltages of MISFETs included in semiconductor devices and provided with a plurality of gate insulating films respectively having different thicknesses. A method relating to a technique of this kind is disclosed in Japanese Patent Laid-Open No. Hei 1-114069. According to this technique, a method of fabricating a semiconductor device, provided with a low-voltage MIS transistor formed on a substrate, and a high-voltage MIS transistor formed on the same substrate, uses a photoresist film for removing a part of an insulating film corresponding to a region for the gate of the low-pressure MIS transistor for introducing an impurity by ion implantation into a region for a channel to change the impurity concentration of the channel before removing the photoresist film. However nothing is disclosed in Japanese Patent Laid-Open No. Hei 1-114069 about a technique for adjusting the threshold voltage when forming an n-channel MISFET and a p-channel MISFET on a substrate or a technique for adjusting the threshold voltage of the high-voltage MIS transistor.

Accordingly, it is an object of the present invention to provide a technique which is capable of adjusting the threshold voltages of a p-channel FET (field-effect transistor) having a relatively thin gate insulating film and an n-channel FET without increasing the number of photomasks and the number of processes for forming and removing photoresist patterns.

Another object of the present invention is to provide a technique which is capable of easily adjusting the threshold voltages of an n-channel FET and a p-channel FET included in a semiconductor device having a substrate provided with two gate insulating films respectively having different thicknesses.

According to a first aspect of the present invention, a method of fabricating a semiconductor device having a semiconductor substrate provided thereon with a relatively thick gate insulating film and a relatively thin gate insulating film comprises the steps of:

(a) forming a first insulating film in regions in a surface of the semiconductor substrate in which the relatively thick gate insulating film and the relatively thin gate insulating film are to be formed;

(b) forming a mask exposing a region in which the relatively thin gate insulating film is to be formed, and covering other regions following the step (a);

(c) introducing an impurity for adjusting the threshold voltages of n-channel FETs and p-channel FETs having the relatively thin gate insulating film into the exposed regions not covered with the mask;

(d) etching parts of the first insulating film, not covered with the mask by using the mask as an etching mask following the step (c); and (e) forming the relatively thick gate insulating film and the relatively thin gate insulating film on the semiconductor substrate following the step (d).

According to a second aspect of the present invention, a method of fabricating a semiconductor device having a semiconductor substrate provided thereon with a relatively thick gate insulating film and a relatively thin gate insulating film comprises the steps of:

(a) forming a first mask having a pattern exposing first regions and covering other regions on the semiconductor substrate, and introducing an impurity for adjusting the threshold voltage of n-channel FETs having the relatively thick gate insulating film in the exposed first regions of the semiconductor substrate;

(b) forming a second mask having a pattern exposing second regions and covering other regions on the semiconductor substrate, and introducing an impurity for adjusting the threshold voltage of p-channel FETs having the relatively thick gate insulating film into the exposed second regions of the semiconductor substrate;

(c) forming a first insulating film in regions in which the relatively thick gate insulating film and the relatively thin gate insulating film are to be formed on the semiconductor substrate following the steps (a) and (b);

(d) forming a third mask having a pattern exposing a region in which the relatively thin gate insulating film is to be formed, and covering other regions following the step (c);

(e) introducing an impurity for adjusting the threshold voltages of the n-channel FETs and the p-channel FETs having the relatively thin gate insulating film into the exposed region not covered with the third mask;

(f) removing parts of the first insulating film not covered with the third mask by etching using the third mask as an etching mask following the step (e); and (g) forming the relatively thick gate insulating film and the relatively thin gate insulating film on the semiconductor substrate following the step (f).

The exposed first regions defined in the step (a) are regions for the n-channel FETs respectively having the relatively thick gate insulating film and the relatively thin gate insulating film, and a first impurity is introduced into the first regions to form p-type regions in the semiconductor substrate.

The exposed second regions defined in the step (b) are regions for the p-channel FETs respectively having the relatively thick gate insulating film and the relatively thin gate insulating film, and a second impurity is introduced into the second regions to form n-type regions in the semiconductor substrate.

In the method of fabricating a semiconductor device according to the present invention, the type of the impurity for adjusting the threshold voltages of the n-channel FETs and the p-channel FETs having the relatively thick gate insulating film, and design energy necessary for the ion-implantation of the impurity may be the same as the type of the impurity for adjusting the threshold voltages of the n-channel FETs and the p-channel FETs having the relatively thin gate insulating film, and design energy necessary for the ion-implantation of the impurity, respectively.

According to a third aspect of the present invention, a method of fabricating a semiconductor device having a semiconductor substrate provided thereon with a relatively thick gate insulating film and a relatively thin gate insulating film comprises the steps of:

(a) forming a first mask which exposes regions for n-channel FETs respectively having the relatively thick gate insulating film and the relatively thin gate insulating film, and a memory region on the semiconductor substrate, and covering other regions on the semiconductor substrate, and introducing an impurity for adjusting the threshold voltage of the n-channel FETs having the relatively thick gate insulating film into the exposed regions;

(b) forming a second mask which exposes regions for p-channel FETs respectively having the relatively thick gate insulating film and the relatively thin gate insulating film on the semiconductor substrate, and covering other regions on the semiconductor substrate, and introducing an impurity for adjusting the threshold voltage of the p-channel FETs having the relatively thick gate insulating film into the exposed regions;

(c) forming a memory forming mask which exposes the memory region, and covers other regions on the semiconductor substrate, and introducing an impurity for adjusting the threshold voltage of memory cell select n-channel FETs into the exposed memory region on the semiconductor substrate;

(d) forming a first insulating film in regions for the relatively thick gate insulating film and the relatively thin gate insulating film, and the memory region following the steps (a), (b) and (c);

(e) forming a third mask which exposes the region for the relatively thin gate insulating film, and covers other regions following the step (d);

(f) introducing an impurity for adjusting the threshold voltages of the n-channel FETs and the p-channel FETs having the relatively thin gate insulating film into the exposed regions not covered with the third mask;

(g) removing exposed parts of the first insulating film not covered with the third mask by etching using the third mask as an etching mask following the step (f); and (h) forming the relatively thick gate insulating film and the relatively thin gate insulating film on the semiconductor substrate following the step (g).

According to a fourth aspect of the present invention, a method of fabricating a semiconductor device having a semiconductor substrate provided thereon with a relatively thick gate insulating film and a relatively thin gate insulating film comprises the steps of:

(a) forming a first mask which exposes regions for n-channel FETs respectively having the relatively thick gate insulating film and the relatively thin gate insulating film, and covering other regions on the semiconductor substrate;

(b) introducing an impurity for adjusting the threshold voltage of the n-channel FETs having the relatively thick gate insulating film into the exposed regions not covered with the first mask;

(c) forming p-type semiconductor regions in the semiconductor substrate by introducing a first impurity into the regions not covered with the first mask;

(d) forming a second mask which exposes regions for p-channel FETs respectively having the relatively thick gate insulating film and the relatively thin gate insulating film, and which covers other regions on the semiconductor substrate;

(e) introducing an impurity for adjusting the threshold voltage of the p-channel FETs having the relatively thick gate insulating film into the exposed regions not covered with the second mask;

(f) forming n-type semiconductor regions in the semiconductor substrate by introducing a second impurity into the exposed regions of the semiconductor substrate not covered with the second mask;

(g) forming a first insulating film in regions on the semiconductor substrate for the relatively thick gate insulating film and the relatively thin gate insulating film following the steps (a) to (f);

(h) forming a third mask which exposes the region for the relatively thin gate insulating film, and covers other regions on the semiconductor substrate following the step (g);

(i) introducing an impurity for adjusting the threshold voltages of the n-channel FETs and the p-channel FETs having the relatively thin gate insulating film into exposed regions not covered with the third mask;

(j) removing exposed parts of the first insulating film by etching using the third mask as an etching mask following the step (i); and (k) forming the relatively thick gate insulating film and the relatively thin gate insulating film on the semiconductor substrate following the step (j).

BRIEF DESCRIPTION OF THE DRAWINGS

The above and other objects, features and advantages of the present invention will become more apparent from the following description taken in connection with the accompanying drawings; in which.

DESCRIPTION OF THE PREFERRED EMBODIMENTS

Figure 1:
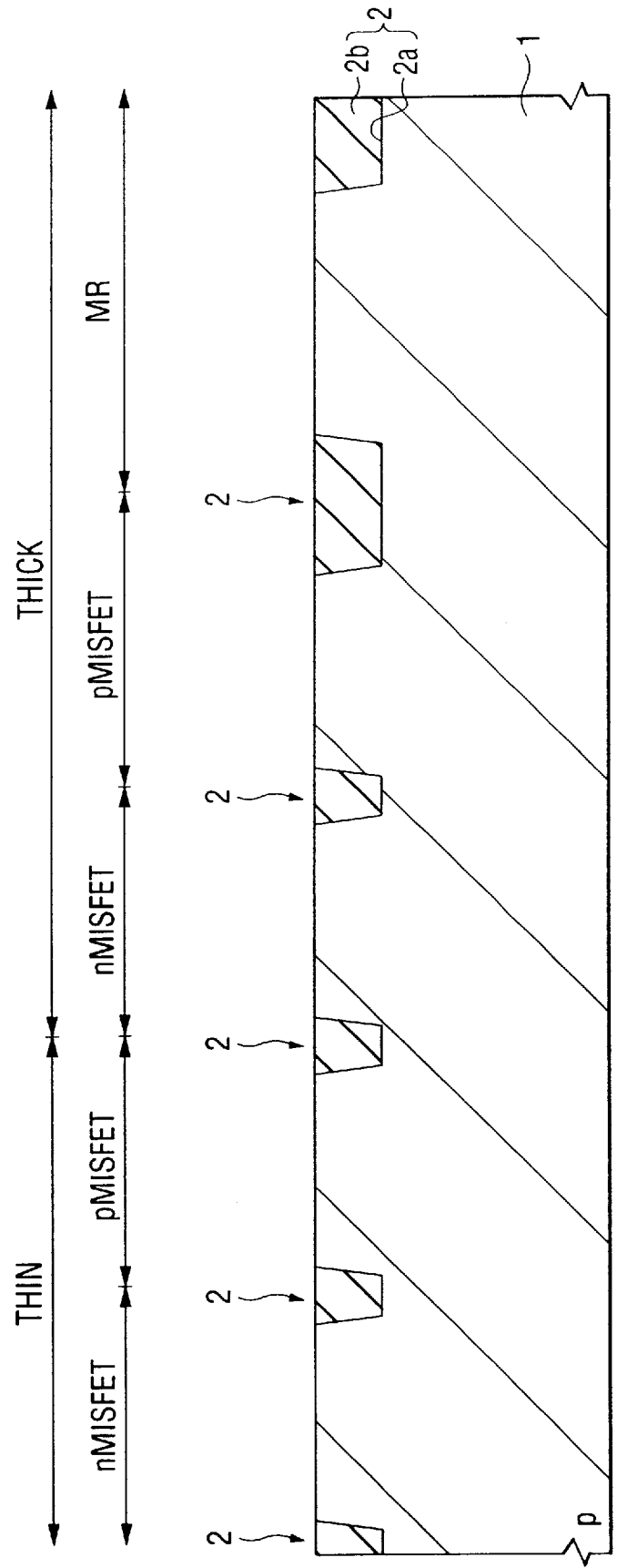
FIG. 1 is a diagrammatic sectional view of a typical part of a semiconductor substrate at a step of a method of fabricating a semiconductor device, representing a first embodiment according to the present invention.

Preferred embodiments of the present invention will be described hereinafter with reference to the accompanying drawings, in which parts having the same functions are designated by the same reference characters throughout and repetitive description thereof will be omitted. Preferred embodiments will be described with reference to fabrication of a DRAM (dynamic random-access memory) or a FRAM (ferroelectric random-access memory). In the following description, a part of a semiconductor substrate in which a relatively thin gate insulating film is formed will be referred to as a "thin-film section", and a part of the semiconductor substrate in which a relatively thick gate insulating film is formed will be referred to as a "thick-film section", the term used for an n-channel metal insulator semiconductor field effect transistor will be abbreviated to nMISFET, and the term used for a p-channel metal insulator semiconductor field effect transistor will be abbreviated to pMISFET.

Referring to FIG. 1, isolating parts 2 are formed in a major surface of a semiconductor substrate 1. The isolating parts 2 are formed by depositing an isolation film 2b, such as a silicon dioxide film, in isolation grooves 2a formed in the major surface of the semiconductor substrate 1. Upper surfaces of the isolating parts 2 are flush with the major surface of the semiconductor substrate 1. In FIG. 1, on the left side there is a thin-film section, and a right side there is a thick-film section.

Figure 2:
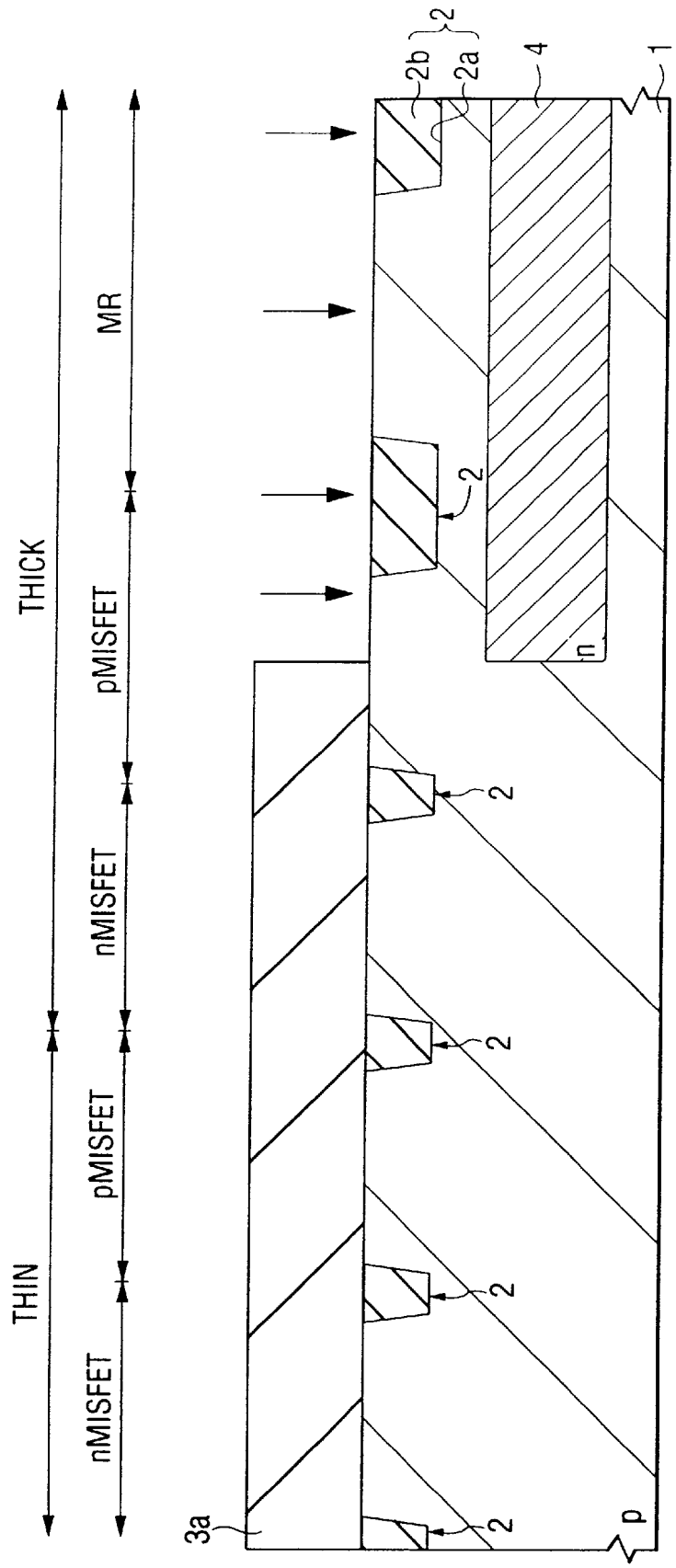
FIG. 2 is a typical sectional view of a part of the semiconductor substrate at a step subsequent to that shown in FIG. 1.

Referring to FIG. 2, a photoresist film 3a is formed on the major surface of the semiconductor substrate 1. The photoresist film 3a is patterned in the form of a mask exposing a buried well region and covering other regions. An impurity, such as P (phosphorus) or As (arsenic), is introduced into the semiconductor substrate 1 by ion implantation using the patterned photoresist film 3a as a mask to form a buried n-type well 4.

Figure 3:
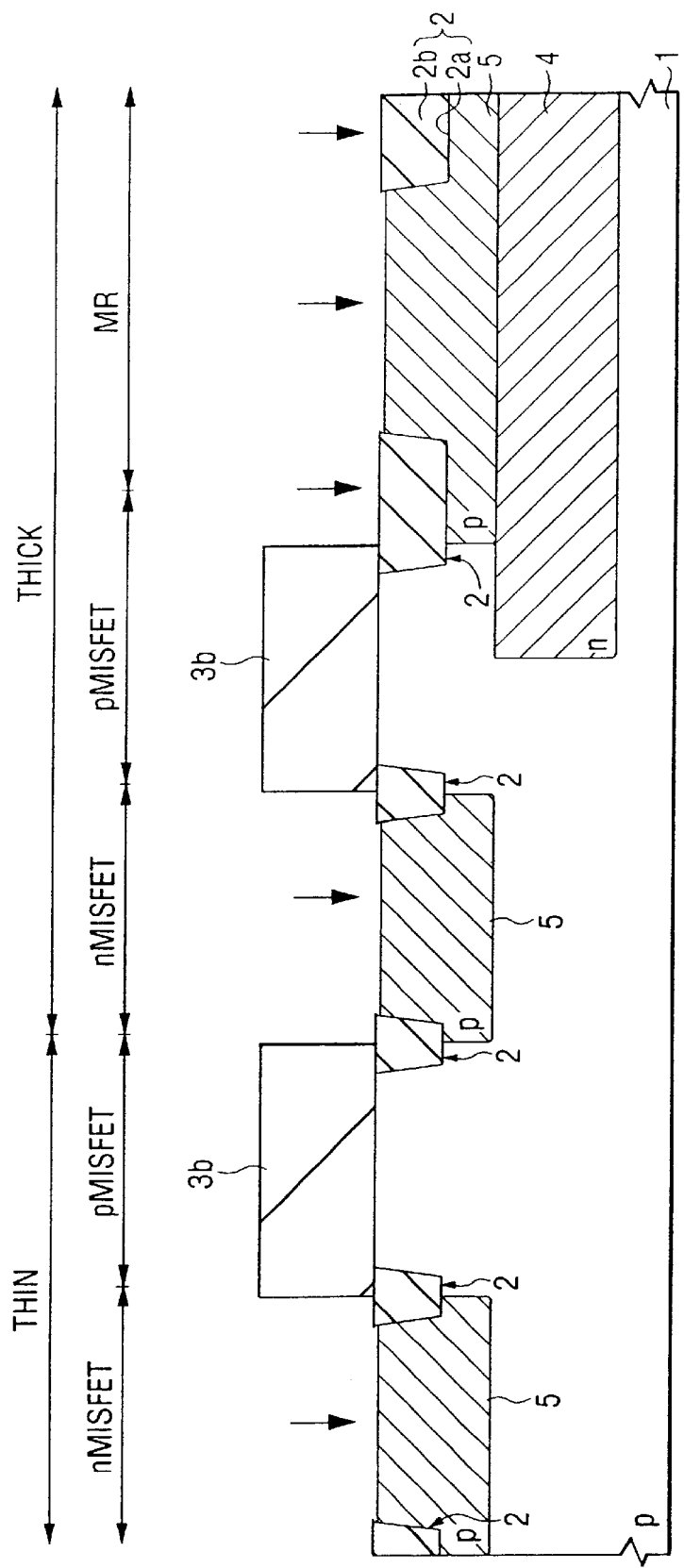
FIG. 3 is a typical sectional view of a part of the semiconductor substrate at a step subsequent to that shown in FIG. 2.

Referring to FIG. 3, the photoresist film 3a is removed, a photoresist film 3b is formed on the major surface of the semiconductor substrate 1, and the photoresist film 3b is patterned in the form of a mask exposing the nMISFET regions (first regions) and a memory region MR, and covering the PMISFET regions. Subsequently, an impurity for forming p-type wells is introduced into the semiconductor substrate 1 by ion implantation using the patterned photoresist film 3b as a mask (first mask), and an impurity for adjusting the threshold voltage of an nMISFET in the thick film section is introduced into the semiconductor substrate 1 by ion implantation using the patterned photoresist mask 3b to form the p-type wells (p-type semiconductor regions) 5.

This embodiment makes it possible to reduce the number of photomasks by introducing the impurity for adjusting the threshold voltage of the nMISFET in the thick-film section into the semiconductor substrate 1 and the number of photoresist film patterning processes by using the photoresist film 3b as a mask. The use of the photoresist film 3b as a mask further enables the omission of a series of processes necessary for patterning a photoresist film including those for spreading a photoresist, prebaking, exposure, development, cleaning and baking, and a process for removing the photoresist film. Consequently, time for fabricating the semiconductor device can be curtailed, and the cost of the semiconductor device can be reduced. Since the amount of foreign matter produced during the formation and removal of the photoresist film can be reduced, the yield and the reliability of semiconductor devices can be improved.

In the process for introducing the impurity into the semiconductor substrate 1 to form the p-type wells, the impurity is ion-implanted in three stages, i.e., a well forming ion implant process, isolation ion implant process and an impurity concentration adjustment ion implant process. When introducing the impurity, such as B (boron) or $BF_2$ (boron difluoride), into the semiconductor substrate 1, those three ion implant processes use different levels of ion-implantation energy to implant the impurity in different peak depth positions of impurity concentration. Ion implant energy for the well forming ion implant process is the highest. The well forming ion implant process determines the basic impurity concentration distribution with respect to the depth the well. Ion implant energy for the isolation ion implant process is the second highest. The isolation ion implant process isolates the adjacent wells electrically. The concentration adjustment ion implant process uses the lowest ion implant energy for the suppression of leakage current between the source and the drain of the MISFET formed in the well region.

An impurity implant process for the adjustment of the threshold voltage of the nMISFET in the thick-film section introduces an impurity, such as B or $BF_2$, into the semiconductor substrate 1. This impurity implant process uses, for example, power of 10 keV and implants the impurity in a dose of about $1\times10^{12}$ atoms/$cm^2$. In this impurity implant process, however, the impurity for the adjustment of the threshold voltage of the nMISFET in the thick section is introduced also into the region for the nMISFET of the thin-film section; that is, the impurity serves also for adjusting the threshold voltage of the nMISFET in the thin-film section.

Figure 4:
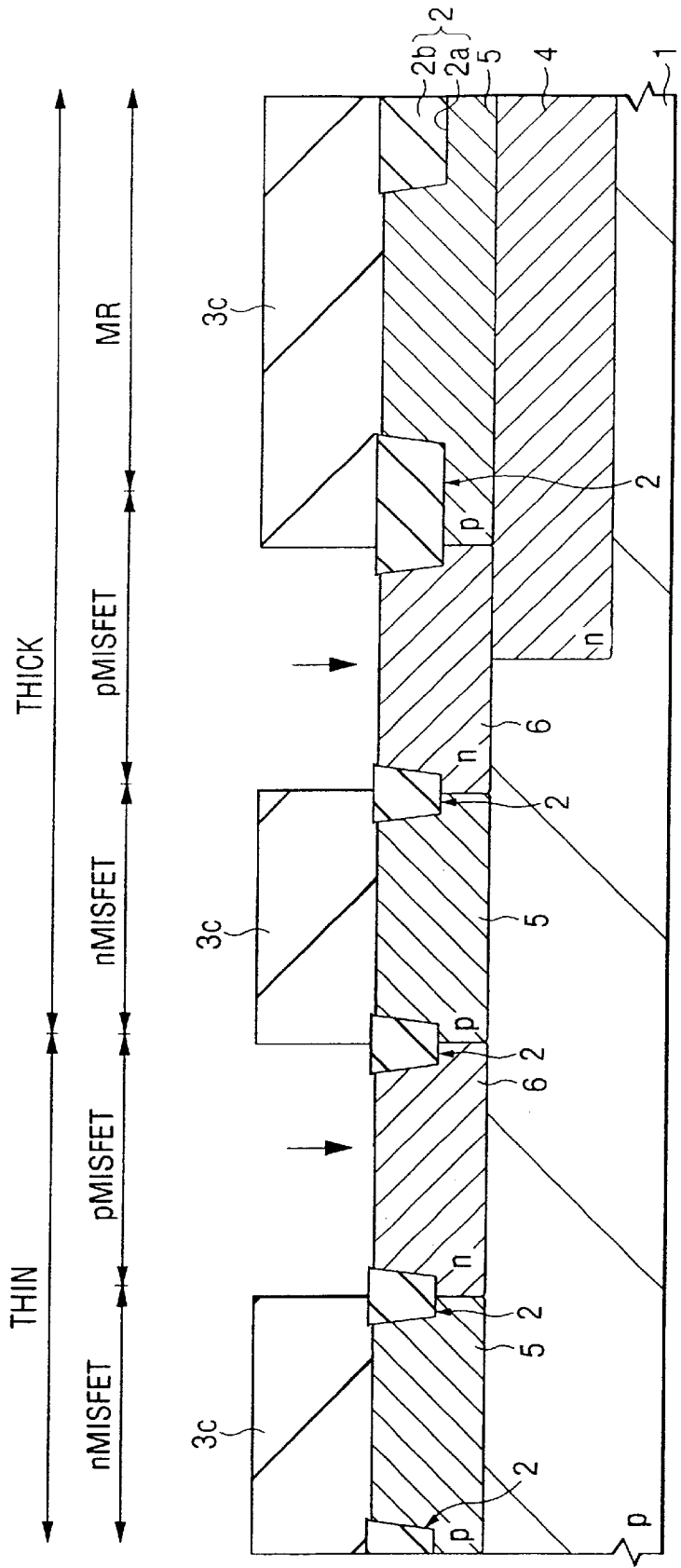
FIG. 4 is a typical sectional view of a part of the semiconductor substrate at a step subsequent to that shown in FIG. 3.

Then, the photoresist film 3b is removed, a photoresist film 3c is formed on the major surface of the semiconductor substrate 1, and the photoresist film 3c is patterned in a mask exposing pMISFET regions, and covering nMISFET regions and the memory region MR. An impurity for forming n-type wells is ion-implanted and an impurity for adjusting the threshold voltage of the pMISFET in the thick-film section is ion-implanted by using the patterned photoresist film 3c as a mask (second mask) to form n-type wells (n-type semiconductor regions) 6, as shown in FIG. 4. The use of the photoresist film 3c for forming the n-type wells as the mask for implanting the impurity for adjusting the threshold voltage of the pMISFET in the thick-film section into the semiconductor substrate 1 reduces the number of photomasks, and omits processes for patterning and removing photoresist films. Consequently, the time required for fabricating the semiconductor device can be curtailed, the cost of the semiconductor device can be reduced, the amount of foreign matter inevitably produced by those processes can be reduced, and the yield and the reliability of the semiconductor device can be improved.

The process for introducing the n-type well forming impurity into the semiconductor substrate 1, similarly to that for forming the p-type wells 5, implants the impurity in three stages, i.e., a well forming ion implant process, an isolation ion implant process and an impurity concentration adjustment ion implant process. This process introduces, for example, P into the semiconductor substrate 1.

The process for introducing the impurity into the semiconductor substrate 1 to adjust the threshold voltage of the pMISFET in the thick-film section uses the same type of impurity and the same ion implant energy as the process for introducing the impurity into the semiconductor substrate 1 to adjust the threshold voltage of the nMISFET in the thick-film section, and the process implants the impurity in a dose of about $6\times10^{12}$ atoms/$cm^2$. Use of the same type of impurity and the same ion implant energy for those processes facilitates threshold voltage adjustment. The impurity used in this process for introducing the impurity into the semiconductor substrate 1 to adjust the threshold voltage of the pMISFET in the thick-film section is introduced also into the region for the pMISFET in the thin-film section and serves also for adjusting the threshold voltage of the pMISFET in the thin-film section.

Figure 5:
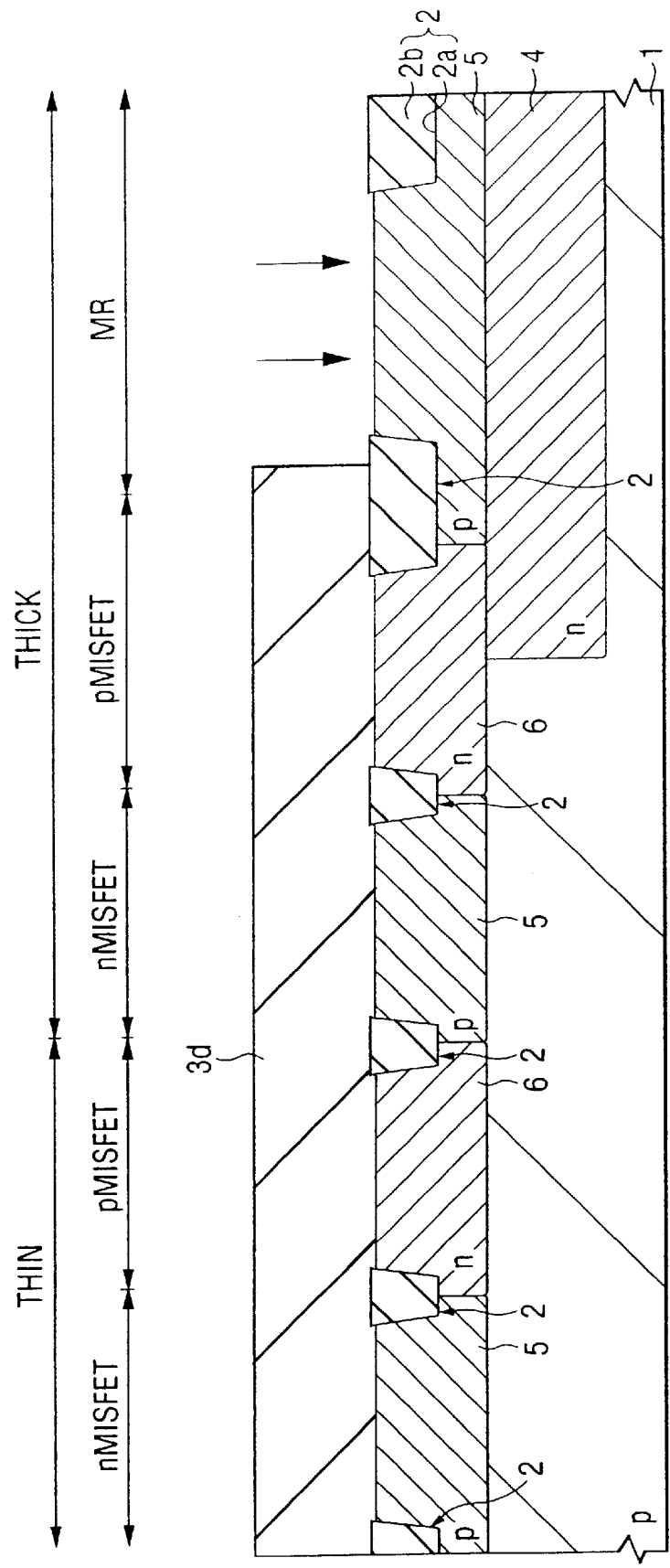
FIG. 5 is a typical sectional view of a part of the semiconductor substrate at a step subsequent to that shown in FIG. 4.

Then, as shown in FIG. 5, the photoresist film 3c is removed, a photoresist film 3d is formed on the major surface of the semiconductor substrate 1, and the photoresist film 3d is patterned in the form of a mask exposing the memory region MR and covering other regions. Subsequently, an impurity for adjusting the threshold voltage of memory cell select MISFETs to be formed in the memory region MR, such as B, is introduced into the semiconductor substrate 1 by ion implantation using the patterned photoresist film 3d as a mask. Thus, the threshold voltage of the memory cell select MISFETs can satisfactorily be determined.

Figure 6:
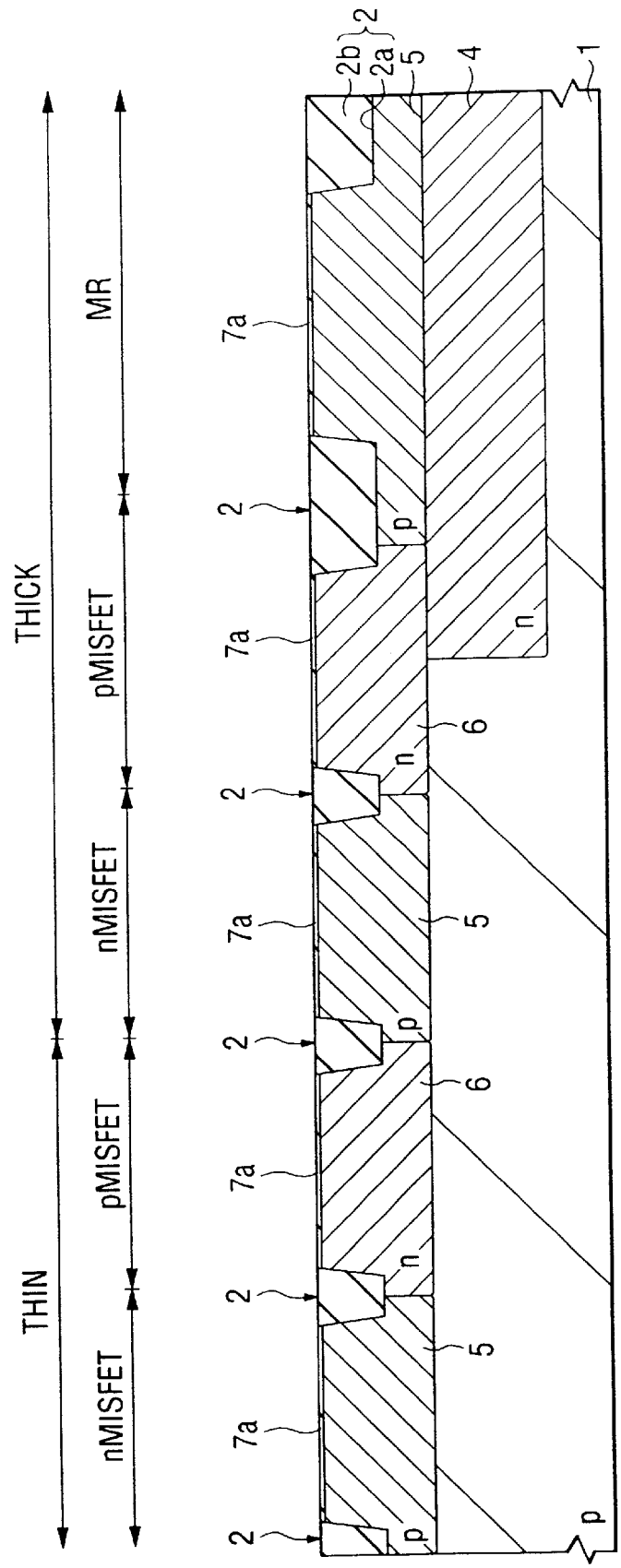
FIG. 6 is a typical sectional view of a part of the semiconductor substrate at a step subsequent to that shown in FIG. 5.

Then, the photoresist film 3d is removed, and the semiconductor substrate 1 is subjected to a heat treatment to activate the impurities introduced into the semiconductor substrate 1 by the preceding impurity introducing processes. Subsequently, the semiconductor substrate 1 is subjected to a first thermal oxidation process to form a gate insulating film (first insulating film) 7a of silicon dioxide to a thickness on the order of, for example, 8 nm over the major surface of the semiconductor substrate 1 (the surfaces of the p-type wells 5 and the n-type wells 6 in FIG. 6), as shown in FIG. 6. The semiconductor substrate 1 may be subjected to a heat treatment in an atmosphere of NO (nitrogen oxide) or $N_2O$ (dinitrogen monoxide) after the gate insulating film 7a has been formed thereon to make nitrogen segregate in the interface between the gate insulating film 7a and the semiconductor substrate 1. When the gate insulating film 7a is as thin as about 8 nm, the strain of the interface between the semiconductor substrate 1 and the gate insulating film 7a due to the difference in coefficient of thermal expansion between the semiconductor substrate 1 and the gate insulating film 7a becomes obvious, and this induces the generation of hot carriers. Nitrogen segregated in the interface between the semiconductor substrate 1 and the gate insulating film 7a relaxes the strain. Therefore, the heat treatment of the semiconductor substrate 1 in an NO or $N_2O$ atmosphere enhances the reliability of the very thin gate insulating film 7a, and suppresses the deterioration of transistors by hot carriers to enhance the reliability of the MISFET.

Figure 7:
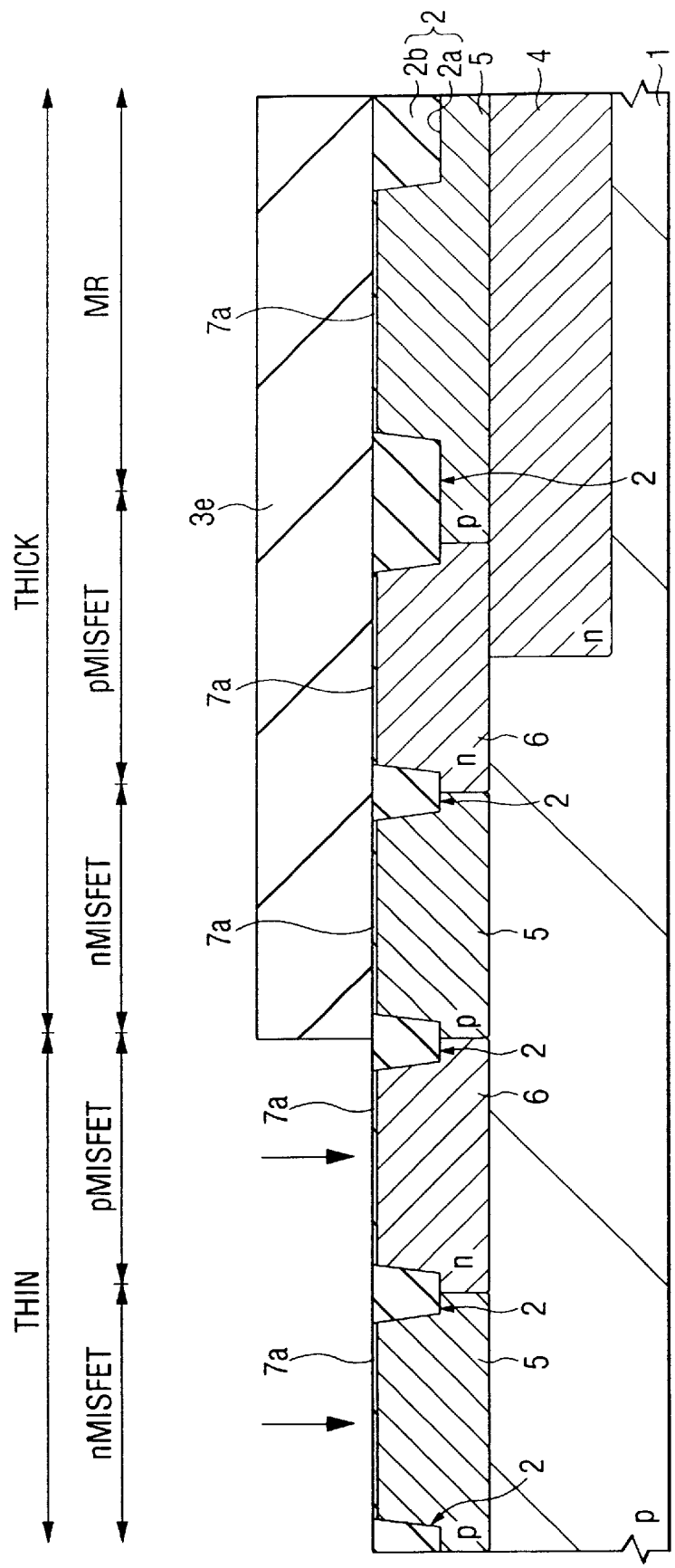
FIG. 7 is a typical sectional view of a part of the semiconductor substrate at a step subsequent to that shown in FIG. 6.

Then, as shown in FIG. 7, a photoresist film 3e is formed on the major surface of the semiconductor substrate 1 and is patterned in a mask exposing the thin-film section, and covering the thick-film section. The photoresist film 3e is used as an etching mask for removing a part of the gate insulating film 7a corresponding to the thin-film section. In this embodiment, the photoresist film 3e is used as a mask for introducing an impurity for adjusting the respective threshold voltages of the nMISFET and the pMISFET in the thin-film section into the semiconductor substrate 1.

Since the photoresist film 3e is used for both removing part of the gate insulating film and introducing the impurity for threshold voltage adjustment into the semiconductor substrate 1, and the impurity for adjusting the threshold voltages of the nMISFET and the pMISFET in the thin-film section are introduced collectively into the semiconductor substrate 1, the respective threshold voltages of the nMISFET and the pMISFET in the thin-film section can be adjusted without an increase in the number of masks and processes for patterning and removing photoresist films. As mentioned above, since the number of photomasks can greatly be reduced, the time required for fabricating the semiconductor device can be curtailed and the cost of the semiconductor device can be reduced. Furthermore, since the amount of foreign matter inevitably produced by those processes can be reduced, and the yield and the reliability of the semiconductor device can be improved.

The process for introducing the impurity into the semiconductor substrate 1 to adjust the respective threshold voltages of the nMISFET and the pMISFET in the thin-film section uses the same ion implant energy and the same type of impurity as the process for introducing the impurity into the semiconductor substrate 1 to adjust the respective threshold voltages of the nMISFET and the pMISFET in the thick-film section. Consequently, the respective threshold voltages of the MISFETs in the thin-film section and the thick-film section can easily be adjusted. The dose of the impurity for the MISFETs in the thin-film section is different from that for the MISFETs in the thick-film section and is, for example, $2\times10^{12}$ atoms/cm$^2$.

Figure 8:
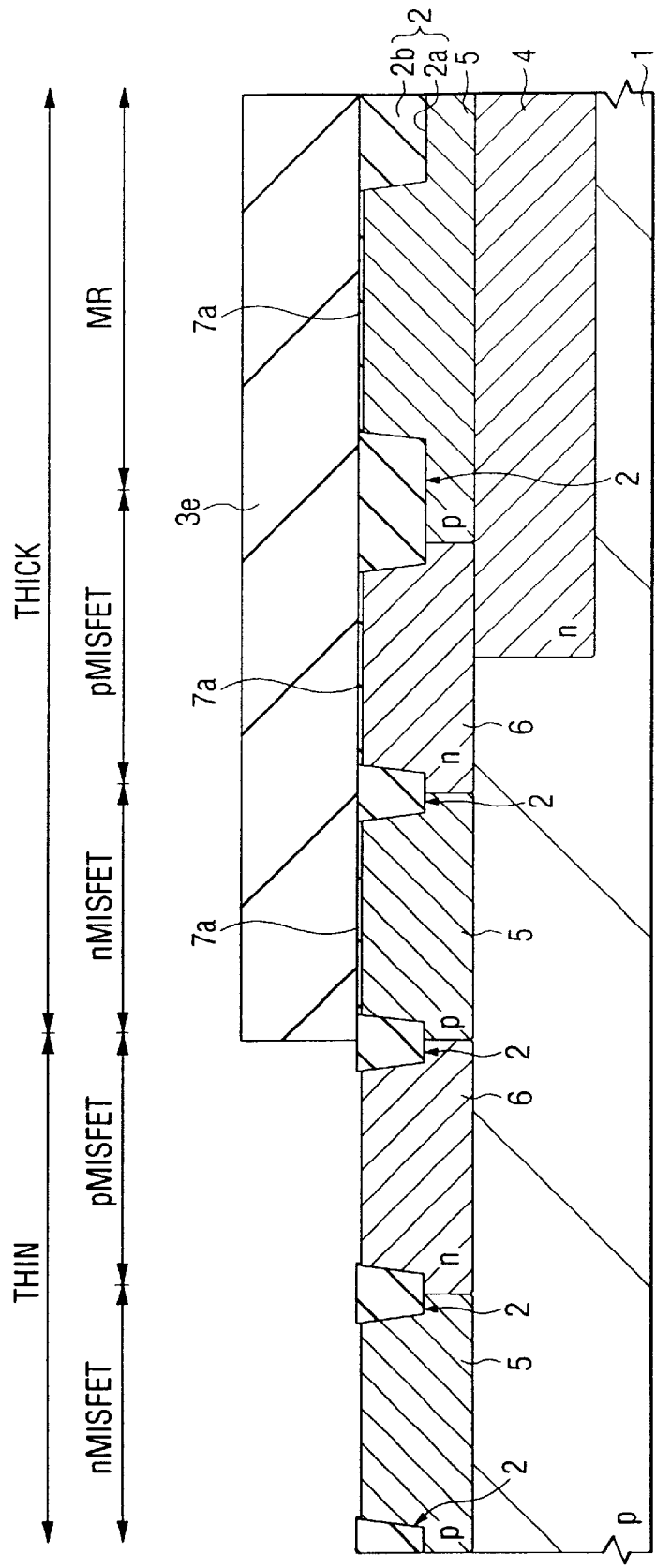
FIG. 8 is a typical sectional view of a part of the semiconductor substrate at a step subsequent to that shown in FIG. 7.
Figure 9:
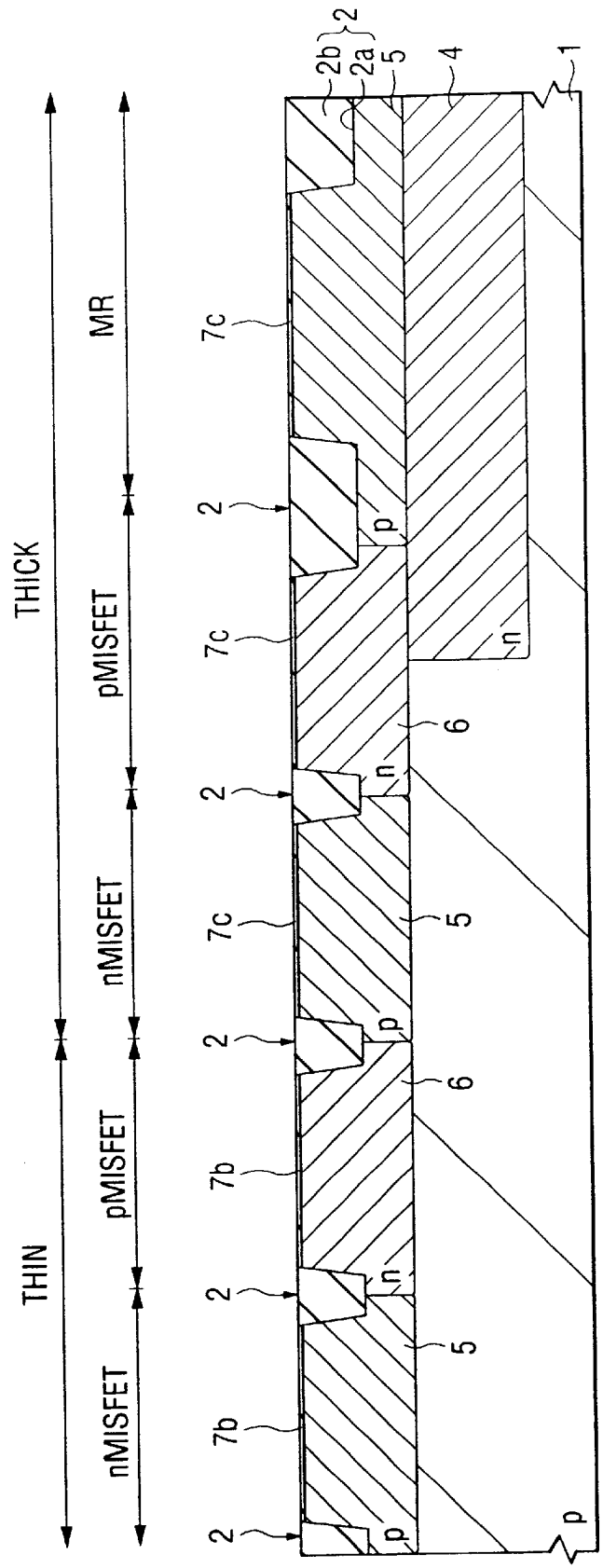
FIG. 9 is a typical sectional view of a part of the semiconductor substrate at a step subsequent to that shown in FIG. 8.

Then, a part of the gate insulating film 7a not covered with the photoresist film 3e is removed by etching to expose a region of the major surface of the semiconductor substrate 1 corresponding to the thin-film section, as shown in FIG. 8. Then, the semiconductor substrate 1 is subjected to a second thermal oxidation process to form a relatively thin gate insulating film 7b in the section of the major surface of the semiconductor substrate 1 corresponding to the thin-film section, and to form a relatively thick gate insulating film 7c in a region of the major surface of the semiconductor substrate 1 corresponding to the thick-film section, as shown in FIG. 9. Both of the gate insulating films 7a and 7b are, for example, silicon dioxide films. The thickness of the gate insulating film 7b in the thin-film section is on the order of, for example, 4 nm, and the thickness of the gate insulating film 7c in the thick-film section is on the order of, for example, 8 nm.

The semiconductor substrate 1 may be subjected to a heat treatment in an atmosphere of NO (nitrogen oxide) or $N_2O$ (dinitrogen monoxide) after the gate insulating films 7b and 7c have been formed thereon to make nitrogen segregate in the interface between the gate insulating film 7b and the semiconductor substrate 1, and the interface between the gate insulating film 7c and the semiconductor substrate 1. The segregation of nitrogen improves the reliability of the very thin gate insulating films 7b and 7c, suppresses the deterioration of transistor characteristics by hot carriers, and enhances the reliability of the MISFETs.

Figure 10:
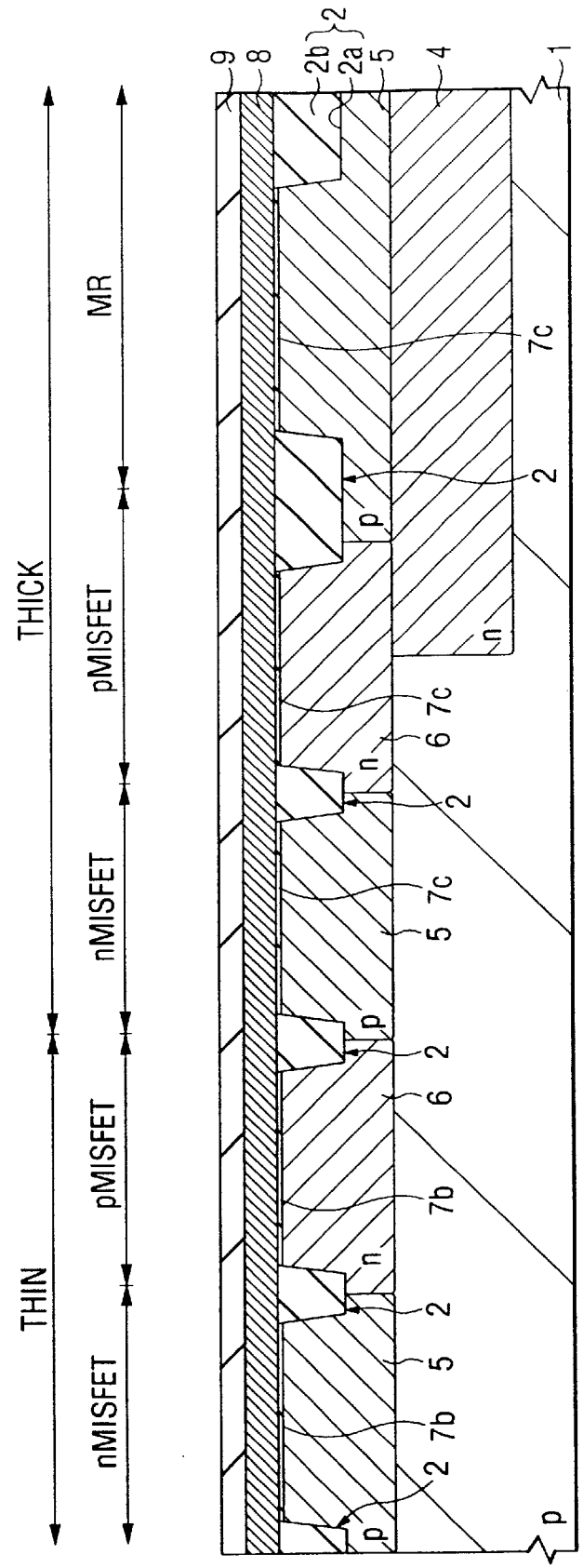
FIG. 10 is a typical sectional view of a part of the semiconductor substrate at a step subsequent to that shown in FIG. 9.

Then, as shown in FIG. 10, a conductive film 8 for forming gate electrodes, and an insulating film 9 for forming a cap insulating film are formed sequentially in that order on the semiconductor substrate 1 by CVD processes or the like. The conductive film 8 is formed of, for example, low-resistance n$^+$-type polysilicon doped with P. The conductive film 8 may be formed of any suitable material other than the low-resistance n$^+$-type polysilicon doped with P. For example, the conductive film 8 may be a two-layer film consisting of a low-resistance n$^+$-type polysilicon film and a tungsten silicide film formed on the low-resistance n$^+$-type polysilicon film, or may be a three-layer film consisting of a low-resistance n$^+$-type polysilicon film, a barrier metal film of tungsten nitride or titanium nitride formed on the low-resistance n$^+$-type polysilicon film, and a metal film, such as a tungsten film, formed on the barrier metal film. The insulating film 9 is, for example, a silicon nitride film.

Figure 11:
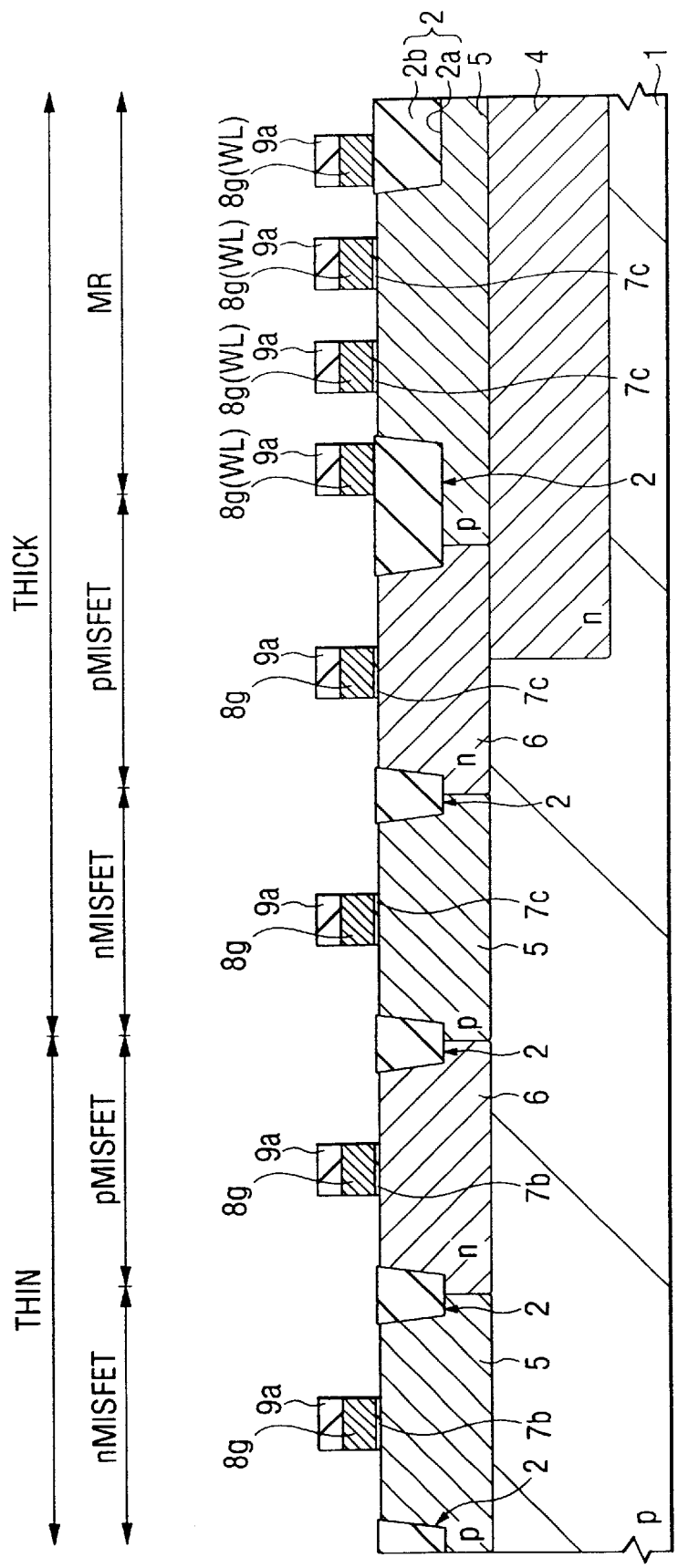
FIG. 11 is a typical sectional view of a part of the semiconductor substrate at a step subsequent to that shown in FIG. 10.
Figure 12:
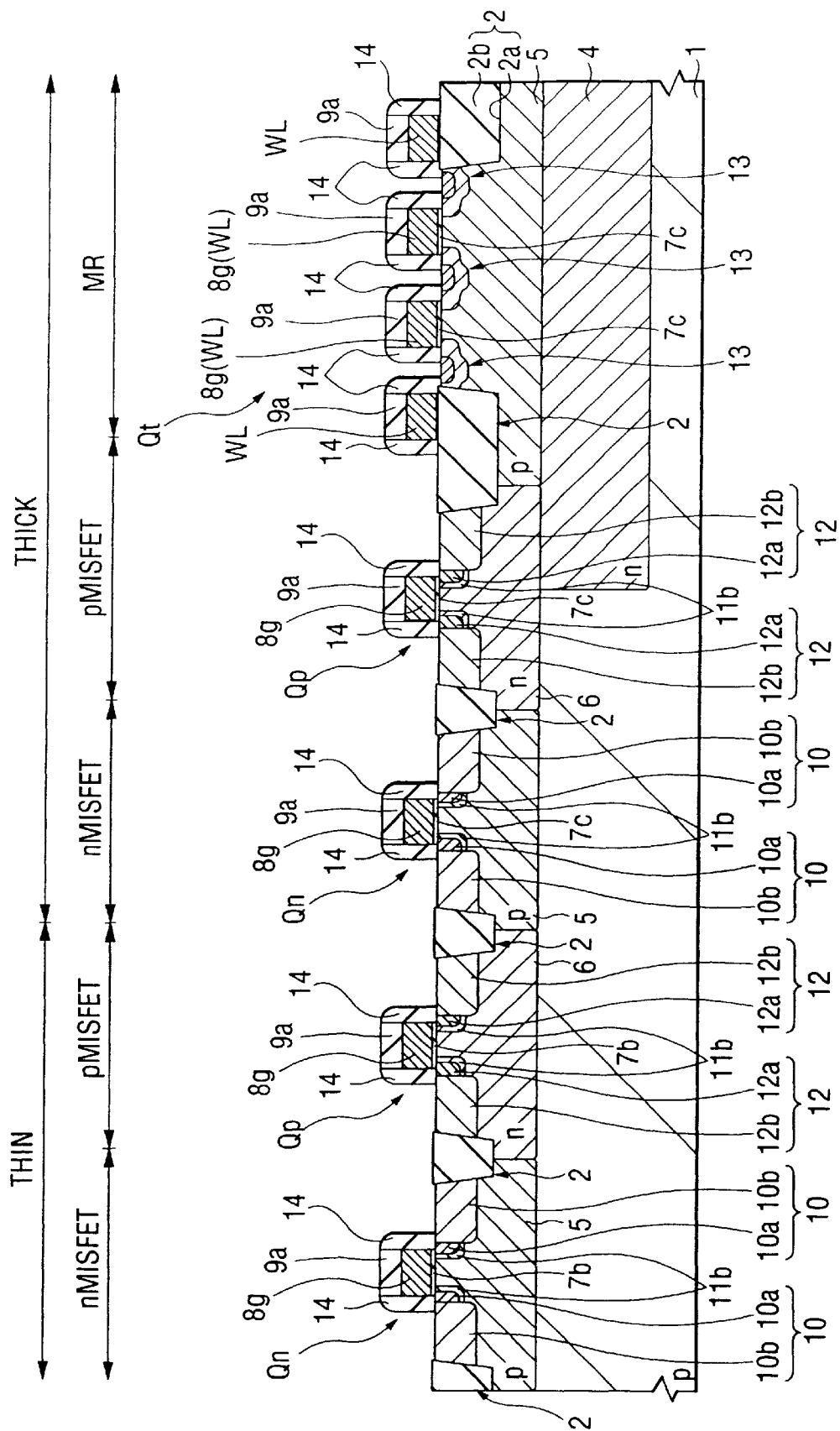
FIG. 12 is a typical sectional view of a part of the semiconductor substrate at a step subsequent to that shown in FIG. 11.

Then, the conductive film 8, the insulating film and the gate insulating films 7b and 7c are patterned by photolithographic techniques and dry etching techniques to form gate electrodes 8g each covered with the cap insulating film 9a, as shown in FIG. 11. The gate electrodes 8g in the memory section are parts of word lines WL. Then, nMISFETs Qn, pMISFETs Qp and memory cell select MISFETs Qt are formed on the semiconductor substrate 1 by a known MISFET forming method, as shown in FIG. 12. The nMISFET Qn and the pMISFET Qp in the thick-film section are used in a word drive circuit or an I/O circuit (input circuit, output circuit or input-output circuit) to which a relatively high voltage is applied. The nMISFET Qn and the pMISFET Qp in the thin-film section are used in a DRAM peripheral circuit, such as a direct peripheral sense amplifier, or a logic circuit to which a relatively low voltage is applied.

The nMISFET Qn in the thin-film section and the nMISFET Qn in the thick-film section differ from each other only in the thickness of the gate insulating films 7b and 7c, and are the same in other respects. The nMISFET Qn comprises a pair of semiconductor regions 10 formed as a source and a drain, the gate insulating film 7b (gate insulating film 7c) and the gate electrode 8g formed on the gate insulating film 7b (gate insulating film 7c). Each of the pair of semiconductor regions 10 has a low-concentration region 10a and a high-concentration region 10b. The low-concentration region 10a and the high-concentration region 10b are doped with the same impurity, such as P or As, and differ from each other in impurity concentration; the impurity concentration of the high-concentration region 10b is higher than that of the low-concentration region 10a. The low-concentration region 10a has functions to suppress a hot electron phenomenon and to reduce parasitic resistance, and is formed near the channel of the nMISFET Qn. A pocket region 11a is formed near the low-concentration region 10a on the side of the channel. The pocket region 11a has a function to prevent source-drain punch through in the nMISFET. The pocket region 11a is doped with, for example, B. The high-concentration region 10b is farther from the channel than the low-concentration region 10a.

The pMISFET Qp in the thin-film section and the pMISFET Qp in the thick-film section differ from each other only in the thickness of the gate insulating films 7b and 7c, and are the same in other respects. The pMISFET Qp comprises a pair of semiconductor regions 12 operating as a source and a drain, the gate insulating film 7b (gate insulating film 7c) and the gate electrode 8g formed on the gate insulating film 7b (gate insulating film 7c). Each of the pair of semiconductor regions 10 has a low-concentration region 12a and a high-concentration region 12b. The low-concentration region 12a and the high-concentration region 12b are doped with the same impurity, such as B, and differ from each other in impurity concentration. The relation in impurity concentration between the low-concentration region 12a and the high-concentration region 12b, the functions and the positions of the low-concentration region 12a and the high-concentration region 12b are the same as those in the nMISFET Qn and hence, a further description thereof will be omitted. A pocket region 11b is formed near the low-concentration region 12a on the side of the channel. The pocket region 11b is doped with, for example, P.

The memory cell select MISFET Qt has a pair of semiconductor regions 13 for the source and the drain, the relatively thick gate insulating film 7c, and the gate electrode 8g formed on the insulating film 7c. The pair of semiconductor regions 13 are doped with, for example, As.

The side walls of the gate electrodes 8g in each region (word lines including the gate electrodes 8g in the memory region) are coated with side wall insulating films 14 of, for example, silicon nitride, respectively. The side wall insulating films 14 are formed by depositing a silicon nitride film on the major surface of the semiconductor substrate 1 by a CVD process or the like after completing the doping processes for forming the low-concentration regions 10a and 12a and the pocket regions 11a and 11b, and then etching back the silicon nitride film using an anisotropic dry etching process.

Figure 13:
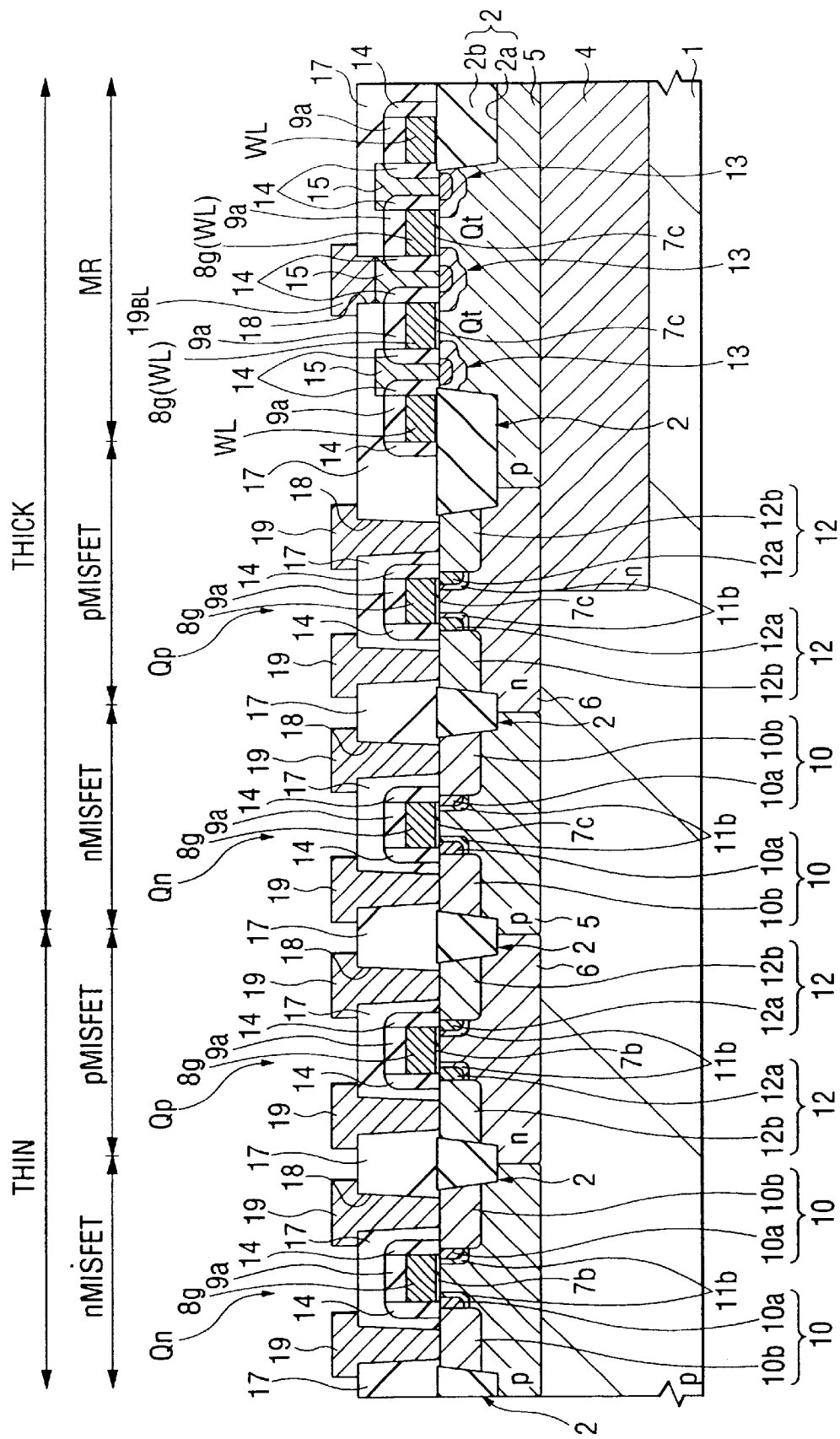
FIG. 13 is a typical sectional view of a part of the semiconductor substrate at a step subsequent to that shown in FIG. 12.
Figure 14:
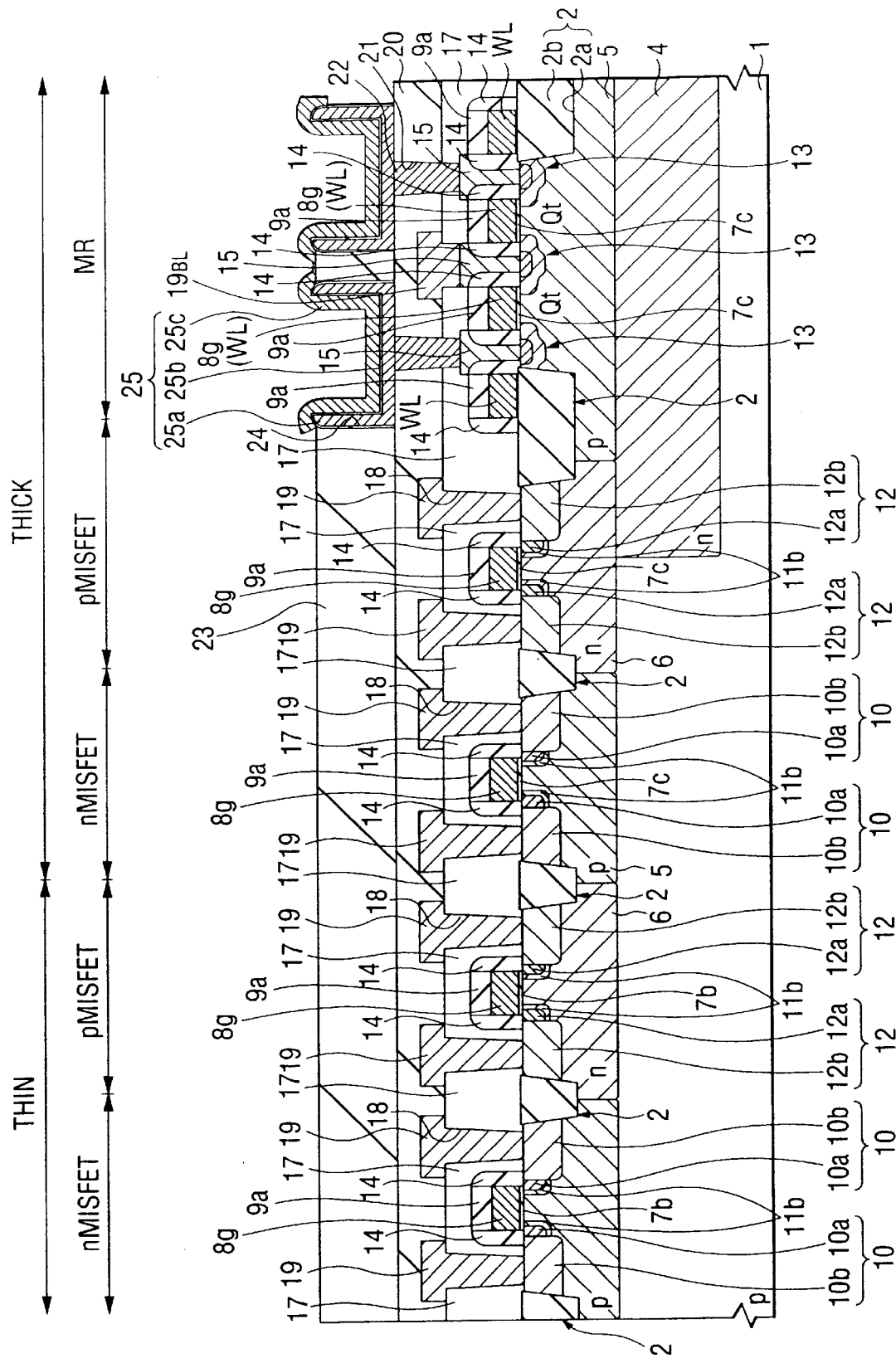
FIG. 14 is a typical sectional view of a part of the semiconductor substrate at a step subsequent to that shown in FIG. 13.

Then, as shown in FIG. 13, plugs 15 of, for example, low-resistance polysilicon are formed. Each plug 15 is connected electrically through a connecting hole 16 to the semiconductor region 13 of the semiconductor substrate 1. The plugs 15 are formed by the following procedure. An insulating film, such as a silicon dioxide film, is formed on the major surface of the semiconductor substrate 1 so as to cover the nMISFETs Qn, the pMISFETs Qp and the memory cell select MISFETs Qt, and the upper surface of the insulating film is flattened by a CMP process (chemical mechanical polishing process) or the like. Subsequently, a connecting hole forming a photoresist film of a pattern exposing the semiconductor regions 13 in the memory region is formed on the insulating film, and then the insulating film is subjected to an etching process using the photoresist film as a mask to form the connecting holes 16 reaching the major surface of the semiconductor substrate 1. Conditions for the etching process are determined so that the silicon dioxide etch is selectively large relative to the silicon nitride etch so as to etch the silicon dioxide film at an etch rate higher than that at which the silicon nitride film is etched. The connecting holes 16 are self-aligned with the gate electrodes 8g of the memory cell select MISFETs Qt. Then, for example, a low-resistance polysilicon film is formed on the insulating film so as to fill up the connecting holes 16, and the polysilicon film is removed by a CMP process or the like leaving only parts thereof filling up the connecting holes 16. These polysilicon parts filling up the connecting holes 16 serve as the plugs 15.

Then, an insulating film 17 of, for example, silicon dioxide is deposited on the semiconductor substrate 1 by a CVD process or the like, and then connecting holes 18 respectively reaching the semiconductor substrate 1 and the plugs 15 are formed in the insulating film 17 by photolithographic techniques and dry etching techniques. Subsequently, a metal film, such as a tungsten film or a tungsten alloy film, is deposited over the insulating film 17 by a sputtering process, a CVD process or the like, so as to fill up the connecting holes 18, and then the metal film is patterned by photolithographic techniques and dry etching techniques to form first-layer wiring lines 19 and bit lines 19BL. Then, an insulating film 20, such as a silicon dioxide film, is formed on the insulating film 17 so as to cover the first-layer wiring lines 19 and the bit lines 19BL by a CVD process or the like, the surface of the insulating film 20 is flattened, and then connecting holes 21 reaching the upper surfaces of the capacitor plug 15 are formed through the insulating films 17 and 20 by photolithographic techniques and dry etching techniques.

Then, a conductive film is formed on the insulating film 20 so as to fill up the connecting holes 21 by a CVD process, a sputtering process or the like, and the conductive film is removed by a CMP process or the like leaving only parts thereof filling up the connecting holes 21. These conductive parts filling up the connecting holes 21 serve as the plugs 22. Then, an insulating film 23 is formed on the insulating film 20 so as to cover the upper surfaces of the plugs 22 by a CVD process or the like. A capacitor hole 24 reaching the upper surfaces of the plugs 22 underlying the insulating film 23 is formed in the insulating film 23 by photolithographic techniques and dry etching techniques. Then, capacitors 25 of a crown type (cylinder type) are formed in the capacitor hole 24. The capacitors 25 are data storing capacitive elements for a DRAM. Each capacitor 25 comprises a lower electrode 25a, a capacitor insulating film 25b and an upper electrode 25c. The lower electrode 25a is, for example, a low-resistance polysilicon film, and is connected electrically by the plug 22 to one of the semiconductor regions of the memory cell select MISFET Qt. The capacitor insulating film 25b is formed, for example, by superposing a film of tantalum pentoxide ($Ta_2O_5$) or silicon dioxide and a film of silicon nitride. The capacitor insulating film 25b is sandwiched between the lower electrode 25a and the upper electrode 25c. When fabricating an FRAM, the capacitor insulating film is formed of a ferroelectric lead oxide, such as Pb (Zr, Ti) or a ferroelectric of bismuth layer structure, such as $Bi_2SrTa_2O_9$. The lower electrode 25a is formed of a metal, such as Pt, Ru, $RuO_x$, Ir or $IrO_x$. After the capacitors 25 have been formed, the DRAM is completed by the processes of a known semiconductor device fabricating method.

FIGS. 15 to 19 show channel impurity concentration profiles, i.e., impurity concentration distribution in a part of the semiconductor substrate 1 directly below the gate electrode 8g, in the MISFETs of the DRAM thus fabricated.

Figure 15:
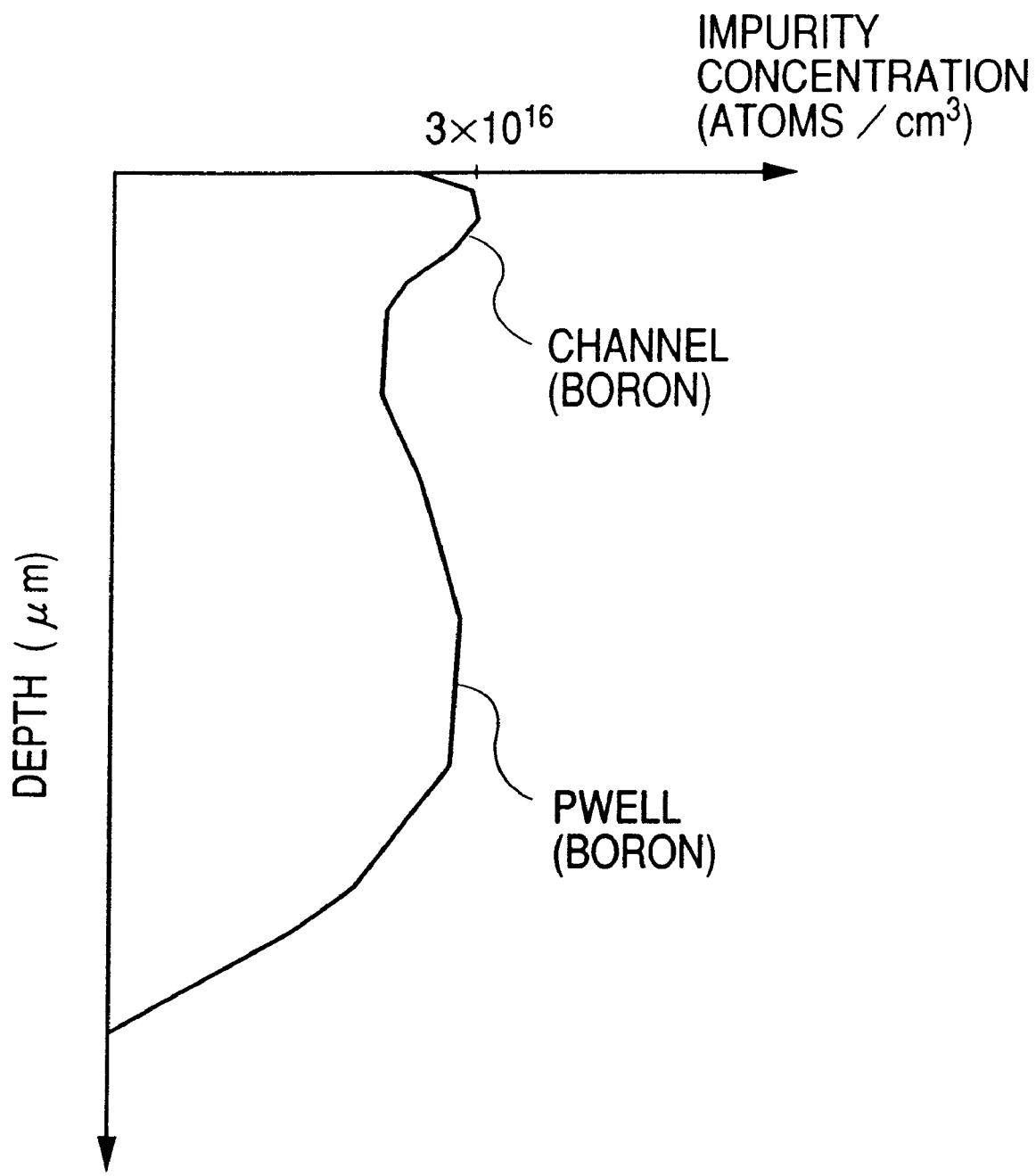
FIG. 15 is a diagram showing the impurity concentration distribution in a channel of an n-channel FET in a thick-film part of a semiconductor device fabricated by a method in accordance with the present invention.

FIG. 15 shows a channel impurity concentration profile in the nMISFET Qn in the thick-film section. This channel impurity concentration profile has peaks of about $3 \times 10^{16}$ atoms/cm$^3$ of an impurity, such as B, at a depth corresponding to the channel of the nMISFET Qn (a position near the major surface of the semiconductor substrate 1) and at a depth deeper than the former. The nMISFET Qn is of a surface channel type having the p-type semiconductor region directly below the gate electrode.

Figure 16:
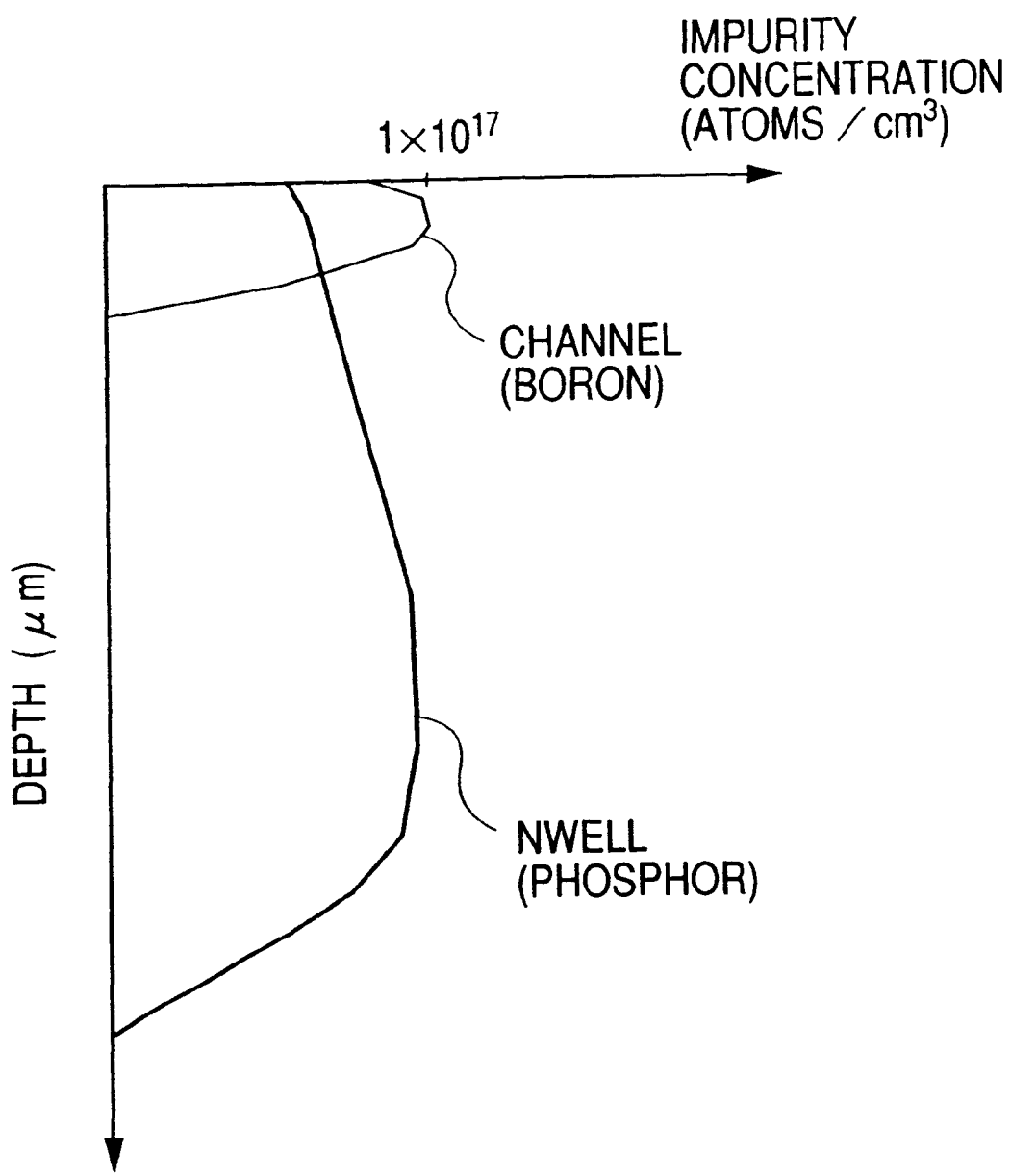
FIG. 16 is a diagram showing the impurity concentration distribution in a channel of a p-channel FET in a thick-film part of the semiconductor device fabricated by a method in accordance with the present invention.

FIG. 16 shows a channel impurity concentration profile in the pMISFET Qp in the thick-film section. This channel impurity concentration profile (p-type semiconductor region) has a peak of about $1 \times 10^{17}$ atoms/cm$^3$ of an impurity at a depth corresponding to the channel of the pMISFET Qp.

The pMISFET Qp is of the buried channel type. An impurity concentration distribution of an impurity, such as P, in the n-type well 5 is formed below the depth corresponding to the peak.

Figure 17:
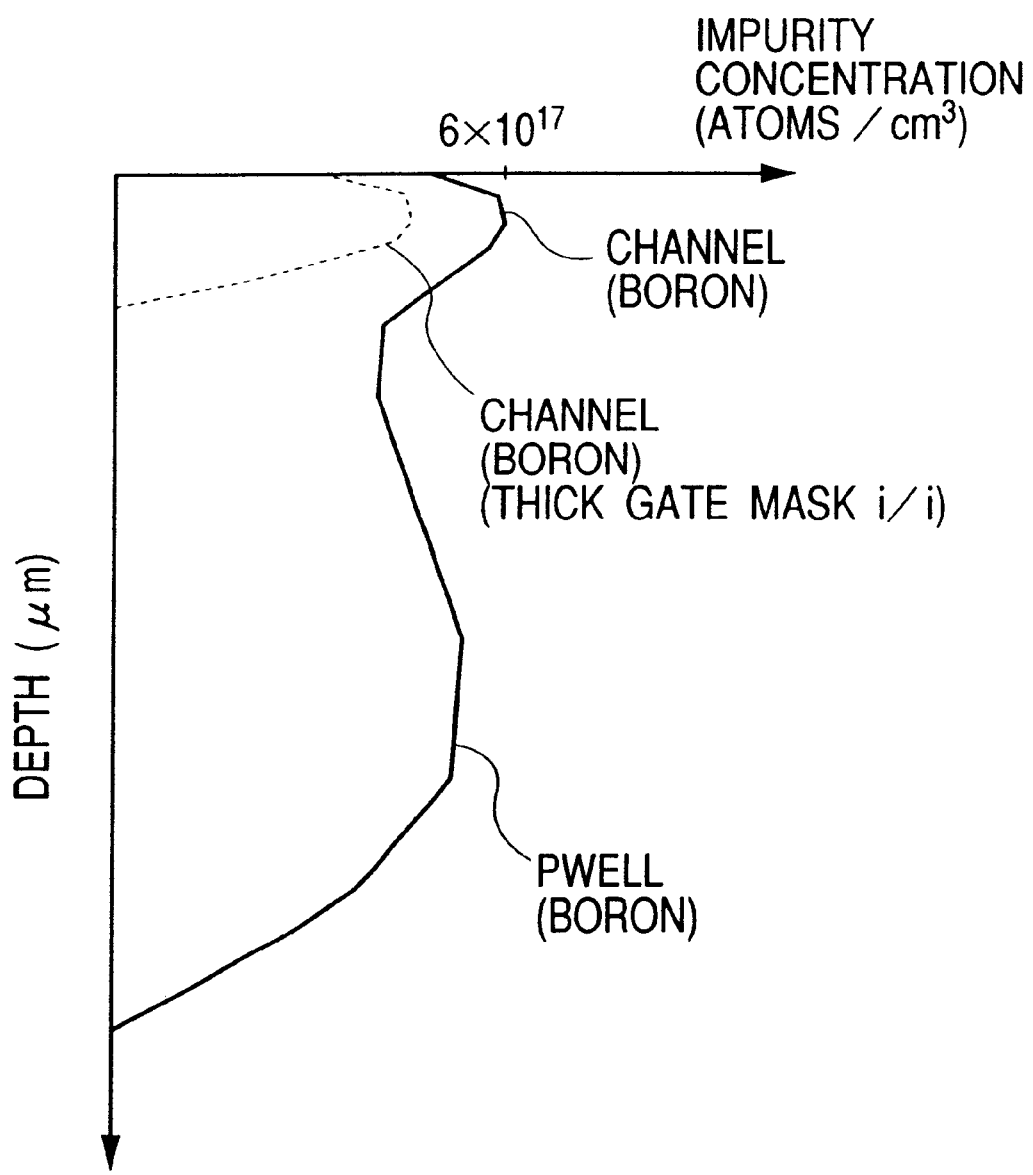
FIG. 17 is a diagram showing the impurity concentration distribution in a channel of an n-channel FET in a thin-film part of the semiconductor device fabricated by a method in accordance with the present invention.

FIG. 17 shows a channel impurity concentration profile in the nMISFET Qn in the thin-film section. This channel impurity concentration profile has peaks of about $6 \times 10^{17}$ atoms/cm$^3$ of an impurity, such as B, at a depth corresponding to the channel of the nMISFET Qn (a position near the major surface of the semiconductor substrate 1) and at a depth deeper than the former. The impurity concentration distribution having a peak at the depth corresponding to the channel is formed by doping for collectively adjusting the threshold voltages of the nMISFET and the pMISFET in the thin-film section and doping for collectively adjusting the threshold voltages of the nMISFET Qn of the thick-film section indicated by broken lines. The nMISFET Qn is of a surface channel type having the p-type semiconductor region directly below the gate electrode.

Figure 18:
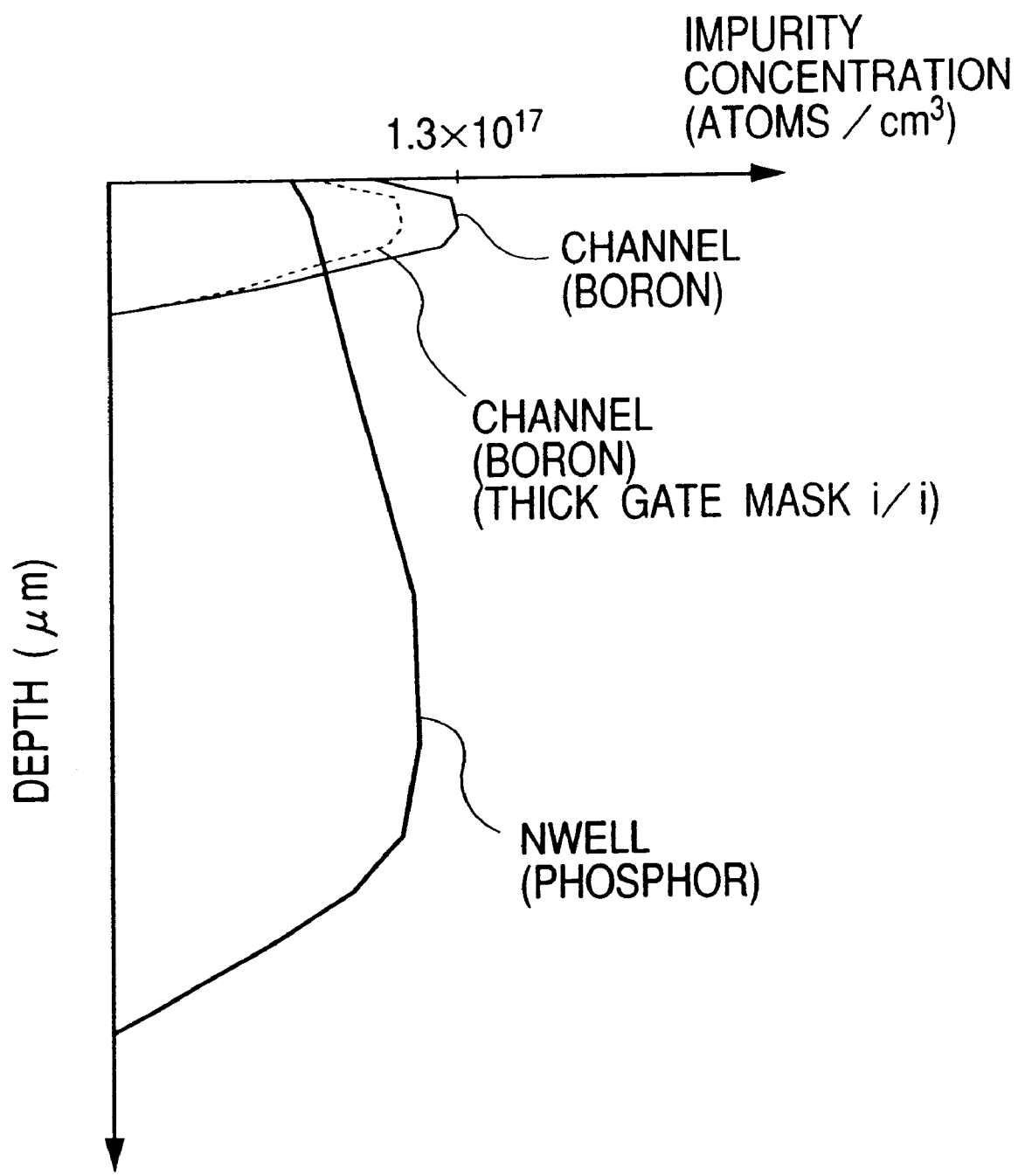
FIG. 18 is a diagram showing the impurity concentration distribution in a channel of a p-channel FET in a thin-film part of the semiconductor device fabricated by a method in accordance with the present invention.

FIG. 18 shows a channel impurity concentration profile in the pMISFET Qp in the thin-film section. This channel impurity concentration profile (p-type semiconductor region) has a peak of about $1.3 \times 10^{17}$ atoms/cm$^3$ at a depth corresponding to the channel of the pMISFET Qp. The pMISFET Qp in the thin-film section has a buried channel structure. This impurity concentration distribution is formed by doping for collectively adjusting the threshold voltages of the nMISFET and the pMISFET in the thin-film section and doping for collectively adjusting the threshold voltages of the pMISFET Qp in the thick-film section indicated by broken lines. An impurity concentration distribution of an impurity, such as P, in the n-type well 5 is formed below the depth corresponding to the peak.

Figure 19:
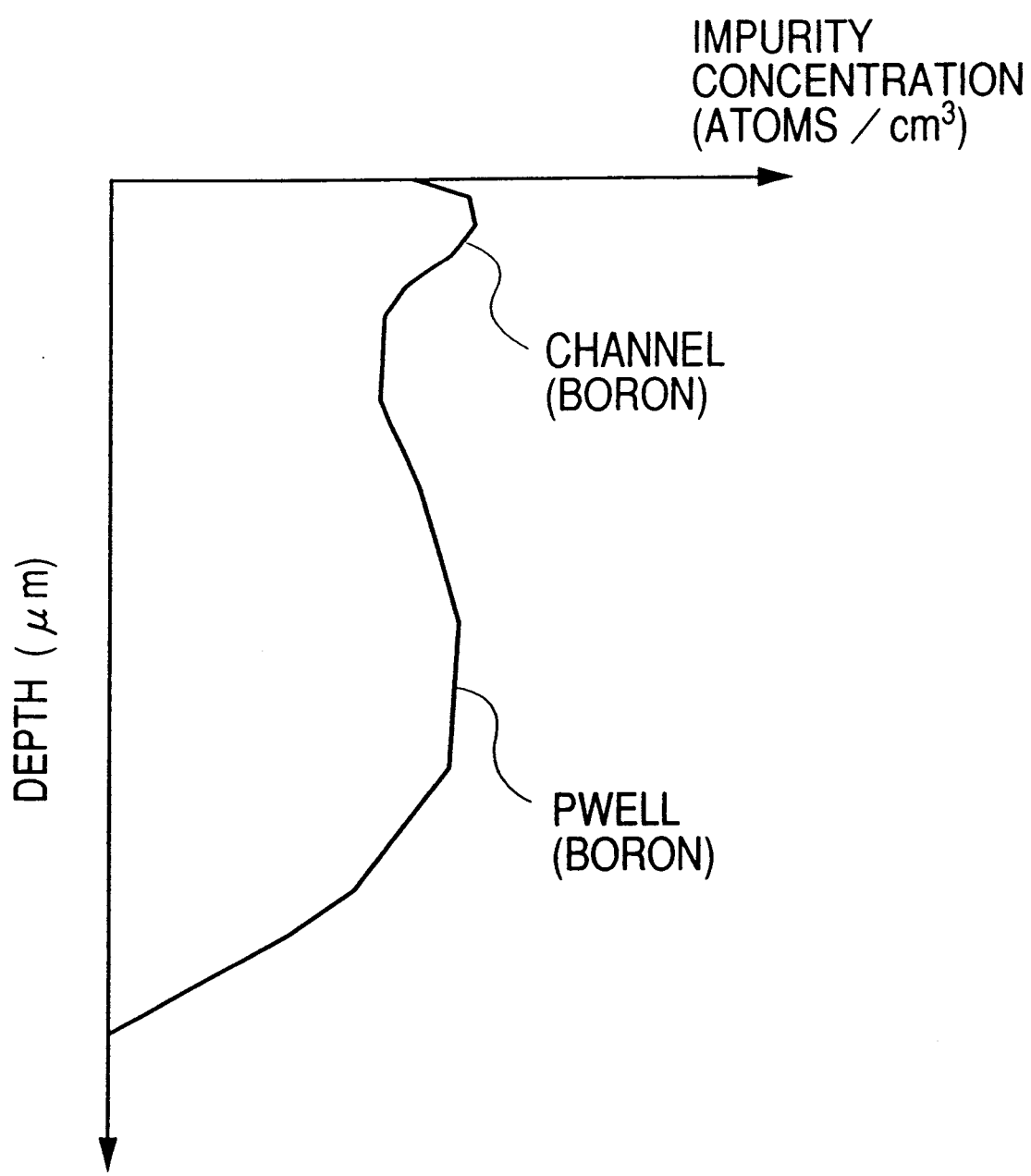
FIG. 19 is a diagram showing the impurity concentration distribution in a channel of a memory cell select FET in a memory region of the semiconductor device fabricated by a method in accordance with the present invention.

FIG. 19 shows a channel impurity concentration profile in the memory cell select MISFET Qt. This channel impurity concentration profile has peaks of impurity, such as B, at a depth corresponding to the channel of the memory cell select MISFET Qt (a position near the major surface of the semiconductor substrate 1) and at a depth deeper than the former. The peak at the depth corresponding to the channel is formed by doping for the adjustment of the threshold voltage of the memory cell select MISFET.

The relation between the threshold voltage of each MISFET and the dose of the impurity for threshold voltage adjustment will be described with reference to FIGS. 20 to 22.

Figure 20:
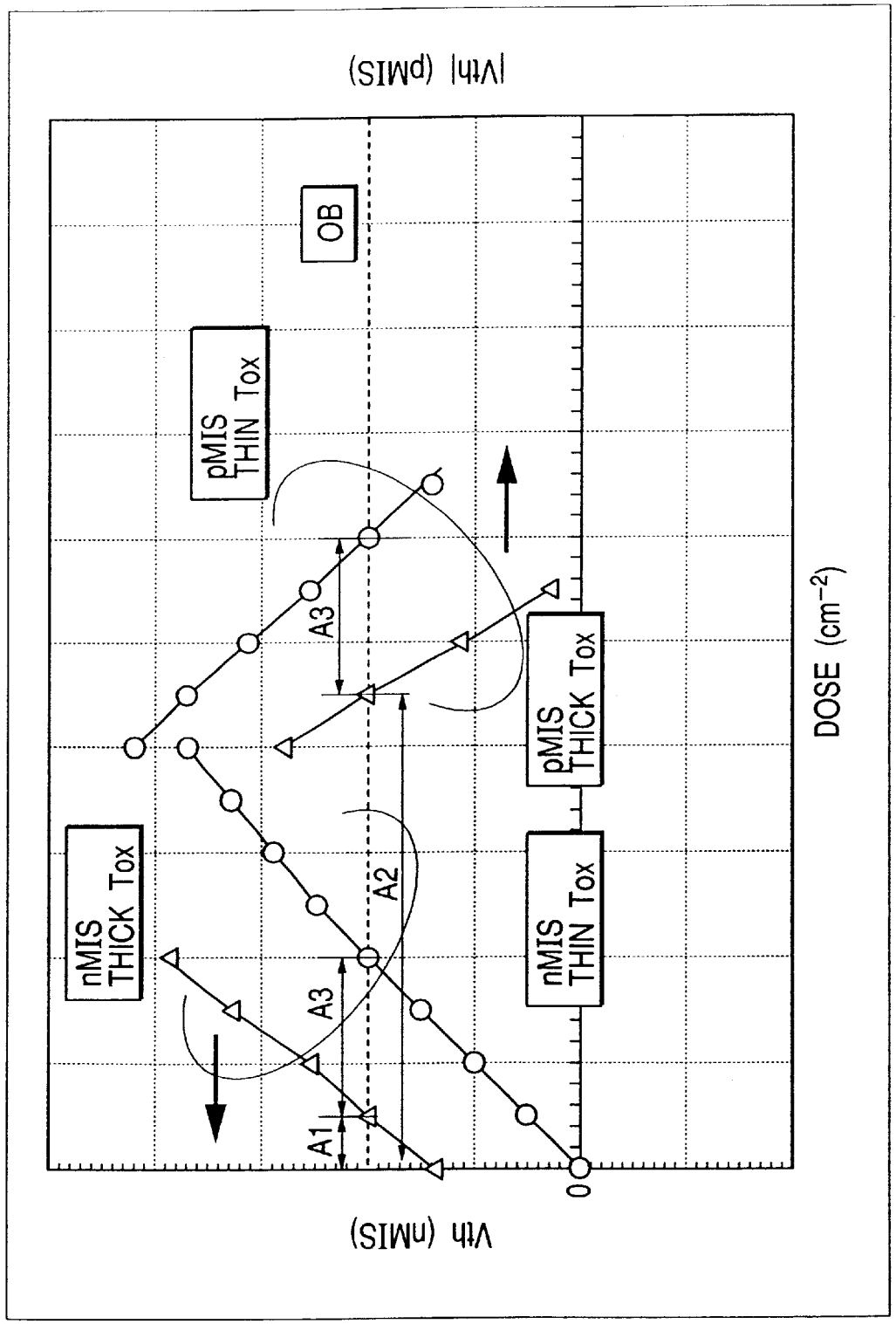
FIG. 20 is a diagram showing the relation between dose and the threshold voltage of a FET included in the semiconductor device fabricated by a method in accordance with the present invention.

FIG. 20 shows the relation between the respective threshold voltages of the nMISFET and the pMISFET during operation, and the dose. In FIG. 20, the absolute value |Vth| of the threshold voltage Vth of the pMISFET during operation is measured on the right vertical axis, the threshold voltage Vth of the nMISFET is measured on the left vertical axis, and the dose (atoms/cm$^2$) is measured on the horizontal axis.

In FIG. 20, all the desired threshold voltages of the MISFETs in the thick-film section and the thin-film section are equal to a desired threshold voltage OB. Therefore it is supposed that all the MISFETs have the same parameters, including gate length and gate width and excluding the types of the impurities for threshold voltage adjustment. Curves connecting triangles indicate the respective threshold voltage characteristics of the nMISFET and the pMISFET in the thick-film section, and curves connecting circles indicate the respective threshold voltage characteristics of the nMISFET and the pMISFET in the thin-film section. The respective inclinations of the threshold voltage characteristic curves of the nMISFET and the pMISFET in the thin-film section are relative to each other, and the respective inclinations of the threshold voltage characteristic curves of the nMISFET and the pMISFET in the thick-film section are reverse to each other.

As mentioned above, this embodiment carries out the process for adjusting the respective threshold voltages of the nMISFET and the pMISFET in the thick-film section first because, as obvious from FIG. 20, the impurity doses for the adjustment of the threshold voltages of the nMISFET and the pMISFET in the thick-film section are smaller than those for the adjustment of the threshold voltages of the nMISFET and the pMISFET in the thin-film section. In the doping process for the adjustment of the threshold voltages of the nMISFET and the pMISFET in the thick-film section, the respective channels of the nMISFET and the pMISFET in the thick-film section are doped with the impurity at different doses A1 and A2, respectively, to adjust the respective threshold voltages of the nMISFET and the pMISFET in the thick-film section to the desired threshold voltage. In the doping process for the adjustment of the threshold voltages of the nMISFET and the pMISFET in the thin-film section, the channels of the nMISFET and the pMISFET in the thin-film section are doped with the impurity at the same dose A3 to adjust the respective threshold voltages of the nMISFET and the pMISFET in the thin-film section to the desired threshold voltage. Thus, the channels of the nMISFET and the pMISFET in the thin-film section can collectively be doped by the doping process for threshold voltage adjustment, which will further be described with reference to FIG. 21.

Figure 21:
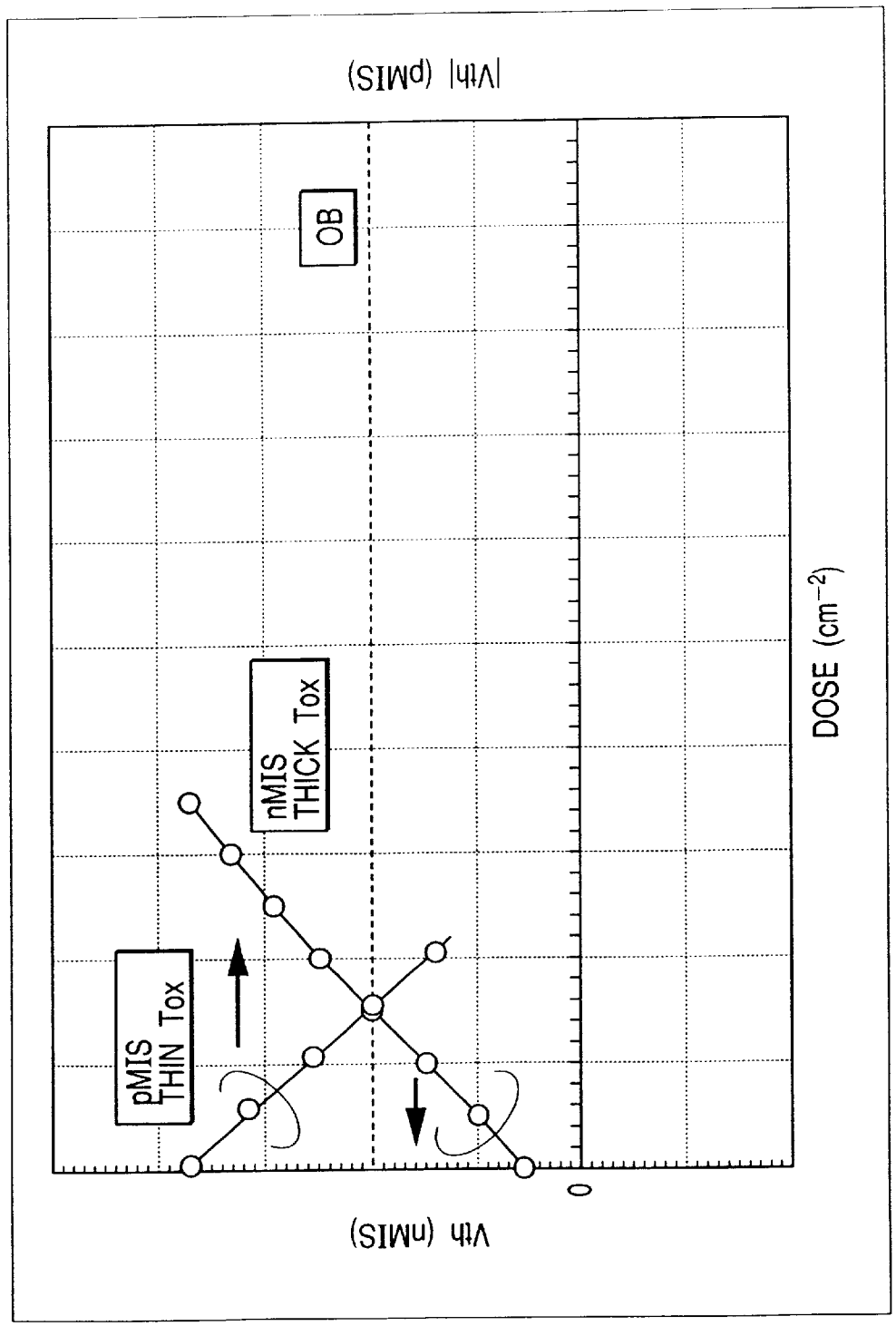
FIG. 21 is a diagram showing the relation between dose and the threshold voltage of a FET formed in a thin-film part of the semiconductor device fabricated by a method in accordance with the present invention.
Figure 22:
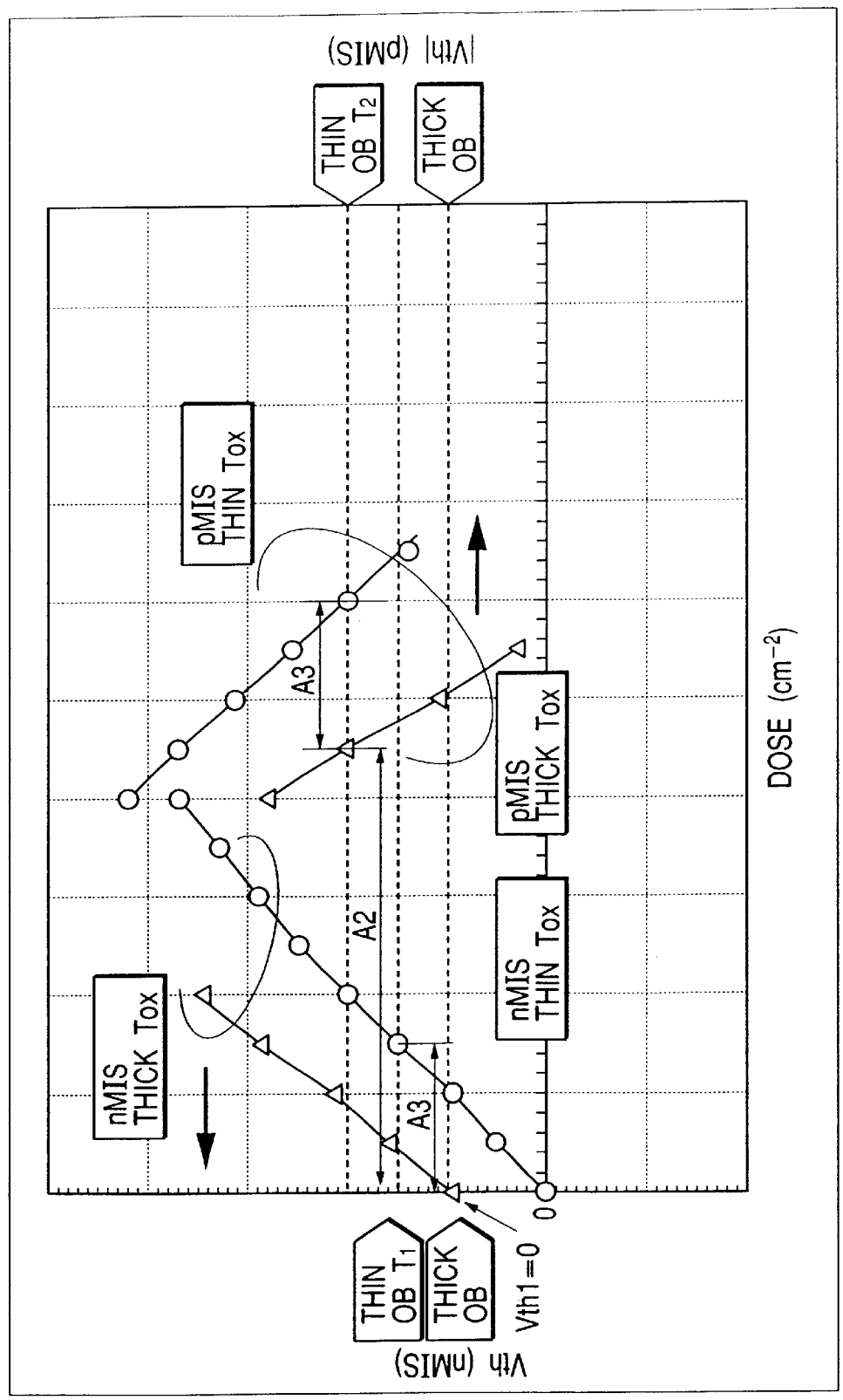
FIG. 22 is a diagram showing the relation between dose and the threshold voltage of a FET fabricated by another method in accordance with the present invention.

FIG. 21 shows the relation between the respective threshold voltages of the nMISFET and the pMISFET in the thin-film section, and the dose for threshold voltage adjustment. In the doping process for the adjustment of the threshold voltage of the nMISFET in the thin-film section, the impurity for the adjustment of the threshold voltage of the nMISFET in the thick-film section is introduced into the region for the nMISFET in the thin-film section. However, the threshold voltage is low if the region for the nMISFET in the thick-film section is doped with only the same impurity. If the region for the pMISFET in the thin-film section is doped with the impurity for the adjustment of the threshold voltage of the pMISFET in the thick-film section, the threshold voltage of the pMISFET in the thin-film section is high. The inventors have found from those facts that both the regions for the nMISFET and the pMISFET must additionally be doped with an impurity, such as B, to raise the threshold voltage of the nMISFET and the reduce the threshold voltage of the pMISFET. Thus, the respective threshold voltages of the nMISFET and the pMISFET in the thin-film section can be adjusted to the desired threshold voltage by additionally doping the regions for the nMISFET and the pMISFET in the thin-film section with the same impurity at the same dose.

In the foregoing description, it is assumed that the threshold voltages of all the MISFETs in the thick-film section and the thin-film section are the same. However, the desired threshold voltage of the nMISFET and the pMISFET in the thin-film section and that of the nMISFET and the pMISFET in the thick-film section may be different from each other as shown in FIG. 22. In FIG. 22, the desired threshold voltage of the nMISFET in the thin-film section is T1, and that of the pMISFET in the thin-film section is T2 different from the desired threshold voltage T1. The respective desired threshold voltages of the nMISFET and the pMISFET in the thick-film section are the same. The respective desired threshold voltages of the nMISFET and the pMISFET in the thin-film section can be adjusted to the desired threshold voltages T1 and T2, respectively, by doping the regions for the nMISFET and the pMISFET in the thin-film section with the impurity at the same dose A3. Even if the respective desired threshold voltages T1 and T2 of the nMISFET and the pMISFET in the thin-film section are different from each other, the regions for the nMISFET and the pMISFET in the thin-film section can collectively be doped. The threshold voltages of the nMISFET and the pMISFET in the thick-film section are, for example, on the order of 0.1 V, the threshold voltage of the nMISFET in the thin-film section is, for example, on the order of 0.15V, and that of the pMISFET in the thin-film section is, for example, on the order of 0.2 V.

Although the preferred embodiment of the present invention has been described, the present invention is not limited thereto in its practical application, and many changes and variations may be made therein without departing from the scope and spirit of the invention.

For example, the capacitors of the memory cells need not necessarily be of the crown type, but may be of a fin type.

Although the invention has been described as applied to the fabrication of a DRAM, the present invention is in general to methods of fabricating semiconductor devices comprising logic circuits, such as microprocessors, memory-logic hybrid semiconductor devices comprising a semiconductor substrate provided thereon with memory circuits and logic circuits, and other semiconductor devices. The present invention is applicable to a method of fabricating a semiconductor device having at least two gate insulating films respectively having different thicknesses, and provided with nMISFETs and pMISFETs formed on a semiconductor substrate. In a memory-logic hybrid semiconductor device, most of the logic LSI circuits including a CPU, a microprocessor and a user logic comprise nMISFETs and pMISFETs formed in the thin-film section to ensure high-speed operations.

The effects of the present invention will be summarized below.

(1) According to the present invention, the impurity for adjusting the threshold voltages of the n-channel field-effect transistor and the p-channel field-effect transistor having a relatively thin gate insulating film is introduced collectively into the region of the major surface of the semiconductor substrate not covered with the mask to be used for removing the first insulating film formed in the region in which the relatively thin gate insulating film is formed by etching. Therefore, the threshold voltages of the n-channel field-effect transistor and the p-channel field-effect transistor having a relatively thin gate insulating film can be adjusted without increasing the number of photomasks and the number of processes for forming and removing photoresist films. Consequently, the yield and the reliability of the semiconductor device are improved and the cost of the semiconductor device can be reduced.

(2) According to the present invention, the p-type semiconductor regions are formed in the semiconductor substrate by introducing the first impurity into regions of the major surface of the semiconductor substrate not covered with the mask used for introducing into the semiconductor substrate the impurity for adjusting the threshold voltages of the n-channel field-effect transistor and the p-channel field-effect transistor having the relatively thick gate insulating film. Therefore, the number of the photomasks and the number of processes for forming and removing the photoresist films can be reduced. Consequently, the yield and the reliability of the semiconductor device are improved and the cost of the semiconductor device can be reduced.

(3) According to the present invention, the n-type semiconductor regions are formed in the semiconductor substrate by introducing the second impurity into regions of the major surface of the semiconductor substrate not covered with the mask used for introducing into the semiconductor substrate the impurity for adjusting the threshold voltage of the n-channel field-effect transistor having the relatively thick gate insulating film. Therefore, the number of the photomasks and the number of the processes for forming and removing the photoresist films can be reduced. Consequently, the yield and the reliability of the semiconductor device are improved and the cost of the semiconductor device can be reduced.

(4) According to the present invention, the type of the impurity for adjusting the threshold voltages of the n-channel field-effect transistor and the p-channel field-effect transistor having the relatively thick gate insulating film, and the design energy for ion implantation for threshold voltage adjustment are the same as the type of the impurity for adjusting the threshold voltages of the n-channel field-effect transistor and the p-channel field-effect transistor having the relatively thin gate insulating film, and the design energy for ion implantation for threshold voltage adjustment, respectively. Accordingly, the threshold voltages can easily be adjusted.

(5) According to the present invention, the memory region is doped by a special doping process for the adjustment of the threshold voltage of the memory cell select n-channel field-effect transistors formed in the memory region. Therefore, the accuracy of operations for setting the threshold voltage of the memory cell select n-channel field-effect transistors can be improved. Consequently, the reliability of the operation of the memory cell select n-channel field-effect transistors can be improved.

(6) According to the present invention, the p-type semiconductor regions are formed in the semiconductor substrate by introducing the first impurity into regions of the major surface of the semiconductor substrate not covered with the mask used in the doping process for adjusting the threshold voltages of the n-channel field-effect transistor having the relatively thick gate insulating film, and the n-type semiconductor regions are formed in the semiconductor substrate by introducing the second impurity into regions of the major surface of the semiconductor substrate not covered with the mask used in the doping process for adjusting the threshold voltages of the p-channel field-effect transistor having the relatively thick gate insulating film. Therefore, the number of photomasks and the number of processes for forming and removing the photoresist films can be reduced. Consequently, the yield and the reliability of the semiconductor device are improved and the cost of the semiconductor device can be reduced.

What is claimed is:

1. A method of fabricating a semiconductor device comprising n-channel field-effect transistors and p-channel field-effect transistors, and having a semiconductor substrate provided thereon with a relatively thick gate insulating film and a relatively thin gate insulating film, said method comprising the steps of:

(a) forming a first insulating film in regions in a surface of the semiconductor substrate in which the relatively thick gate insulating film and the relatively thin gate insulating film are to be formed;

(b) forming a mask exposing a region in which the relatively thin gate insulating film is to be formed, and covering other regions following the step (a);

(c) introducing an impurity for adjusting threshold voltages of n-channel field-effect transistors and p-channel field-effect transistors having the relatively thin gate insulating film into the exposed region not covered with the mask;

(d) etching parts of the first insulating film, not covered with the mask by using the mask as an etching mask following the step (c); and (e) forming the relatively thick gate insulating film and the relatively thin gate insulating film on the semiconductor substrate following the step (d).

2. The method according to claim 1, wherein gate electrodes of the n-channel field-effect transistors and the p-channel field-effect transistors having the relatively thin gate insulating film are of an $n^+$-type, the n-channel field-effect transistors are of a surface channel type, the p-channel field-effect transistors are of a buried channel type, and the impurity for the threshold voltage adjustment forms p-type semiconductor regions.

3. The method according to claim 1, further comprising, following the step (e), the steps of:

forming a conductive film for forming gate electrodes on the relatively thick gate insulating film and the relatively thin gate insulating film formed on the semiconductor substrate; and forming gate electrodes of the n-channel field-effect transistors and the p-channel field-effect transistors having the relatively thick gate insulating film and those having the relatively thin gate insulating film by patterning the conductive film for forming gate electrodes.

4. A method of fabricating a semiconductor device comprising n-channel field-effect transistors and p-channel field-effect transistors, and having a semiconductor substrate provided thereon with a relatively thick gate insulating film and a relatively thin gate insulating film, said method comprising the steps of:

(a) forming a first mask having a pattern exposing first regions and covering other regions on the semiconductor substrate, and introducing an impurity for adjusting threshold voltage of n-channel field-effect transistors having the relatively thick gate insulating film in the exposed first regions of the semiconductor substrate;

(b) forming a second mask having a pattern exposing second regions and covering other regions on the semiconductor substrate, and introducing an impurity for adjusting threshold voltage of p-channel field-effect transistors having the relatively thick gate insulating film into the exposed second regions of the semiconductor substrate;

(c) after removing said second mask, forming a first insulating film in regions in which the relatively thick gate insulating film and the relatively thin gate insulating film are to be formed on the semiconductor substrate following the steps (a) and (b);

(d) forming a third mask having a pattern exposing a region in which the relatively thin gate insulating film is to be formed, and covering other regions following the step (c);

(e) introducing an impurity for adjusting threshold voltages of n-channel field-effect transistors and p-channel field-effect transistors having the relatively thin gate insulating film into the exposed regions;

(f) removing parts of the first insulating film not covered with the third mask by etching using the third mask as an etching mask following the step (e); and (g) forming the relatively thick gate insulating film and the relatively thin gate insulating film on the semiconductor substrate following the step (f).

5. The method according to claim 4, wherein the exposed first regions defined in the step (a) are regions for the n-channel field-effect transistors respectively having the relatively thick gate insulating film and the relatively thin gate insulating film, and a first impurity is introduced into the first regions not covered with the first mask to form p-type regions in the semiconductor substrate.

6. The method according to claim 4, wherein the exposed second regions defined in the step (b) are regions for the p-channel field-effect transistors respectively having the relatively thick gate insulating film and the relatively thin gate insulating film, and a second impurity is introduced into the second regions to form n-type regions in the semiconductor substrate.

7. The method according to claim 4, wherein gate electrodes of the n-channel field-effect transistors and the p-channel field-effect transistors having the relatively thick gate insulating film and the relatively thin gate insulating film are of an $n^+$-type, the n-channel field-effect transistors having the relatively thick gate insulating film and the relatively thin gate insulating film are of a surface channel type, the p-channel field-effect transistors having the relatively thick gate insulating film and the relatively thin gate insulating film are of a buried channel type, and the impurity for the threshold voltage adjustment of the n-channel field-effect transistors and the p-channel field-effect transistors having the relatively thick gate insulating film and the relatively thin gate insulating film forms p-type semiconductor regions.

8. The method according to claim 4, wherein the type of the impurity for adjusting the threshold voltages of the n-channel field-effect transistors and the p-channel field-effect transistors having the relatively thick gate insulating film, and the energy necessary for the ion-implantation of the impurity, are the same as the type of the impurity for adjusting the threshold voltages of the n-channel field-effect transistors and the p-channel field-effect transistors having the relatively thin gate insulating film, and the design energy necessary for the ion-implantation of the impurity, respectively.

9. The method according to claim 4, further comprising, following the step (g), the steps of:

forming a conductive film for forming gate electrodes on the relatively thick gate insulating film and the relatively thin gate insulating film on the semiconductor substrate; and forming gate electrodes of the n-channel field-effect transistors and the p-channel field-effect transistors having the relatively thick gate insulating film and those having the relatively thin gate insulating film by patterning the conductive film for forming gate electrodes.

10. A method of fabricating a semiconductor device comprising n-channel field-effect transistors and p-channel field-effect transistors, and having a semiconductor substrate provided thereon with a relatively thick gate insulating film and a relatively thin gate insulating film, said method comprising the steps of:

(a) forming a first mask exposing regions for n-channel field-effect transistors respectively having the relatively thick gate insulating film and the relatively thin gate insulating film, and a memory region on the semiconductor substrate, and covering other regions on the semiconductor substrate, and introducing an impurity for adjusting threshold voltage of the n-channel field-effect transistors having the relatively thick gate insulating film into the exposed regions;

(b) forming a second mask exposing regions for p-channel field-effect transistors respectively having the relatively thick gate insulating film and the relatively thin gate insulating film on the semiconductor substrate, and covering other regions on the semiconductor substrate, and introducing an impurity for adjusting threshold voltage of the p-channel field-effect transistors having the relatively thick gate insulating film into the exposed regions;

(c) after removing said second mask, forming a first insulating film in regions for the relatively thick gate insulating film and the relatively thin gate insulating film, and the memory region following the steps (a) and (b);

(d) forming a third mask exposing the region for the relatively thin gate insulating film, and covering other regions following the step (c);

(e) introducing an impurity for collectively adjusting threshold voltages of the n-channel field-effect transistors having the relatively thin gate insulating film into the exposed regions not covered with the third mask;

(f) removing exposed parts of the first insulating film not covered with the third mask by etching using the third mask as an etching mask following the step (e); and (g) forming the relatively thick gate insulating film and the relatively thin gate insulating film on the semiconductor substrate following the step (f).

11. The method according to claim 10 further comprising the step of forming p-type semiconductor regions in the semiconductor substrate by introducing a first impurity into the regions not covered with the first mask formed by the step (a).

12. The method according to claim 10 further comprising the step of forming n-type semiconductor regions in the semiconductor substrate by introducing a second impurity into the regions not covered with the second mask formed by the step (b).

13. The method according to claim 10, wherein gate electrodes of all the n-channel field-effect transistors and the p-channel field-effect transistors formed on the semiconductor substrate are of an $n^+$-type, all the n-channel field-effect transistors formed on the semiconductor substrate are of a surface channel type, all the p-channel field-effect transistors formed on the semiconductor substrate are of a buried channel type, and the impurity for the threshold voltage adjustment of the n-channel field-effect transistors and the p-channel field-effect transistors having the relatively thick gate insulating film and the relatively thin gate insulating film forms p-type semiconductor regions.

14. The method according to claim 10, wherein the type of the impurity for adjusting the threshold voltages of the n-channel field-effect transistors and the p-channel field-effect transistors having the relatively thick gate insulating film, and the energy necessary for the ion-implantation of the impurity, are the same as the type of the impurity for adjusting the threshold voltages of the n-channel field-effect transistors and the p-channel field-effect transistors having the relatively thin gate insulating film, and the design energy necessary for the ion-implantation of the impurity, respectively.

15. The method according to claim 10 further comprising, following the step (g), the steps of:

forming a conductive film for forming gate electrodes on the relatively thick gate insulating film and the relatively thin gate insulating film formed on the semiconductor substrate; and forming gate electrodes of all the n-channel field-effect transistors and all the p-channel field-effect transistors by patterning the conductive film for forming gate electrodes.

16. The method according to claim 10 further comprising, preceding the step (c), the step of forming a memory forming mask exposing the memory region and covering other regions on the semiconductor substrate, and introducing an impurity for adjusting the threshold voltage of memory cell select n-channel field-effect transistors in the memory region not covered with the memory forming mask.

17. A method of fabricating a semiconductor device comprising n-channel field-effect transistors and p-channel field-effect transistors, and having a semiconductor substrate provided thereon with a relatively thick gate insulating film and a relatively thin gate insulating film, said method comprising the steps of:

(a) forming a first mask exposing regions for n-channel field-effect transistors respectively having the relatively thick gate insulating film and the relatively thin gate insulating film, and covering other regions on the semiconductor substrate;

(b) introducing an impurity for adjusting threshold voltage of the n-channel field-effect transistors having the relatively thick gate insulating film into the exposed regions not covered with the first mask;

(c) forming p-type semiconductor regions in the semiconductor substrate by introducing a first impurity into the regions not covered with the first mask;

(d) forming a second mask exposing regions for p-channel field-effect transistors respectively having the relatively thick gate insulating film and the relatively thin gate insulating film, and covering other regions on the semiconductor substrate;

(e) introducing an impurity for adjusting threshold voltage of the p-channel field-effect transistor having the relatively thick gate insulating film into the exposed regions not covered with the second mask;

(f) forming n-type semiconductor regions in the semiconductor substrate by introducing a second impurity into the exposed regions of the semiconductor substrate not covered with the second mask;

(g) after removing said second mask, forming a first insulating film in regions on the semiconductor substrate for the relatively thick gate insulating film and the relatively thin gate insulating film following the steps (a) to (f);

(h) forming a third mask exposing the region for the relatively thin gate insulating film, and covering other regions on the semiconductor substrate following the step (g);

(i) introducing an impurity for adjusting threshold voltages of the n-channel field-effect transistors and the p-channel field-effect transistors having the relatively thin gate insulating film in an exposed region not covered with the third mask;

(j) removing exposed parts of the first insulating film by etching using the third mask as an etching mask following the step (i); and (k) forming the relatively thick gate insulating film and the relatively thin gate insulating film on the semiconductor substrate following the step (j).

* * * * *